United States Patent [19]

Duluk, Jr.

[11] Patent Number: 4,996,666
[45] Date of Patent: Feb. 26, 1991

[54] CONTENT-ADDRESSABLE MEMORY SYSTEM CAPABLE OF FULLY PARALLEL MAGNITUDE COMPARISONS

[76] Inventor: Jerome F. Duluk, Jr., 304 Emerson St., Palo Alto, Calif. 94306

[21] Appl. No.: 231,717

[22] Filed: Aug. 12, 1988

[51] Int. Cl.⁵ .................. G11C 13/00; G11C 15/00
[52] U.S. Cl. .................... 365/49; 365/189.01; 365/230.01
[58] Field of Search ............... 365/49, 230.01, 230.03, 365/189.01, 189.07

[56] References Cited

U.S. PATENT DOCUMENTS

| | | | |
|---|---|---|---|
| 4,532,606 | 7/1985 | Phelps | 365/49 |
| 4,559,618 | 12/1985 | Houseman et al. | 365/49 |
| 4,622,653 | 11/1986 | McElroy | 365/49 |
| 4,670,858 | 6/1987 | Almy | 365/49 |
| 4,758,982 | 7/1988 | Price | 365/49 |
| 4,794,559 | 12/1988 | Greenberger | 365/49 |

Primary Examiner—Terrell W. Fears
Attorney, Agent, or Firm—Flehr, Hohbach, Test, Albritton & Herbert

[57] ABSTRACT

A content-addressable memory for storing a plurality of words, each word comprising a plurality of data subfields, and each data subfield comprising a plurality of data bits. Query operations simultaneously compare input data to all subfields in all words and selectably test each subfield for either equality, less-than, less-than-or-equal-to, greater-than, greater-than-or-equal-to, inequality, or don't care. A flag memory comprising a plurality of flag bits for each word stores the results of a selectable Boolean operation performed on a set of flag bits and the query results. A mask register causes selected bit positions within words to be treated as not being present. A priority resolver finds the highest priority flag bit in a particular logic state for selecting a word for reading or writing. A content-addressable memory system composed of a plurality of content-addressable memories and an external priority resolver for selecting between content-addressable memories for reading or writing.

25 Claims, 20 Drawing Sheets

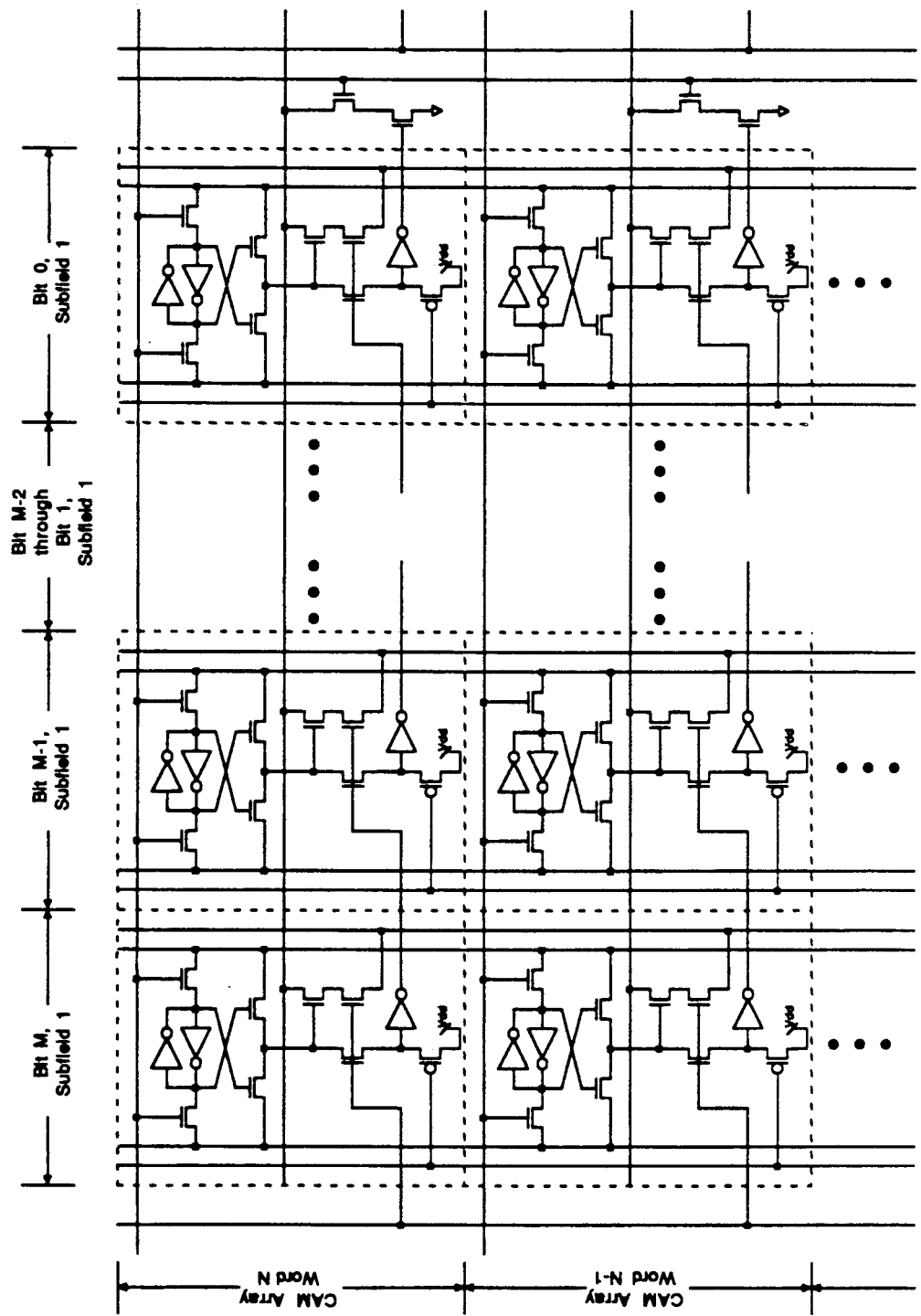

Figure 4A

| CamOp 29 | QueryOp 41 | Mask Register Bit 50 | DataIn Bit | CamBit 85 | CamBit* 87 | ComparisonOp 89 | Equality* 91 |
|---|---|---|---|---|---|---|---|
| Read | X | X | out | stored data | stored data* | X | X |
| Write | X | X | 0 | 0 | 1 | X | X |
| Write | X | X | 1 | 1 | 0 | X | X |
| Query | data = input | X | 0 | 0 | 1 | 0 | 0 |
| Query | data = input | X | 1 | 1 | 0 | 0 | 0 |
| Query | data < input | X | 0 | 0 | 1 | 0 | 1 |
| Query | data < input | X | 1 | 1 | 0 | 1 | 1 |
| Query | data ≤ input | X | 0 | 0 | 1 | 0 | 0 |
| Query | data ≤ input | X | 1 | 1 | 0 | 1 | 0 |
| Query | data > input | X | 0 | 0 | 1 | 1 | 1 |
| Query | data > input | X | 1 | 1 | 0 | 0 | 1 |
| Query | data ≥ input | X | 0 | 0 | 1 | 1 | 0 |
| Query | data ≥ input | X | 1 | 1 | 0 | 0 | 0 |
| Query | data ≠ input | X | 0 | 0 | 1 | 1 | 1 |
| Query | data ≠ input | X | 1 | 1 | 0 | 1 | 1 |
| Query | don't care | X | X | 0 | 0 | 1 | 0 |
| Read Mask Register | X | X | out | X | X | X | X |
| Write Mask Register | X | X | X | X | X | X | X |
| Addressed Read | X | X | out | stored data | stored data* | X | X |
| Addressed Write | X | X | 0 | 0 | 1 | X | X |
| Addressed Write | X | X | 1 | 1 | 0 | X | X |
| No Operation | X | X | X | X | X | X | X |
| Masked Write | X | 0 | X | undriven | undriven | X | X |
| Masked Write | X | 1 | 0 | 0 | 1 | X | X |
| Masked Write | X | 1 | 1 | 1 | 0 | X | X |
| Masked Query | X | 0 | X | 0 | 0 | 1 | n/a |
| Masked Query | data = input | 1 | 0 | 0 | 1 | 0 | 0 |
| Masked Query | data = input | 1 | 1 | 1 | 0 | 0 | 0 |
| Masked Query | data < input | 1 | 0 | 0 | 1 | 0 | 1 |
| Masked Query | data < input | 1 | 1 | 1 | 0 | 1 | 1 |
| Masked Query | data ≤ input | 1 | 0 | 0 | 1 | 0 | 0 |
| Masked Query | data ≤ input | 1 | 1 | 1 | 0 | 1 | 0 |
| Masked Query | data > input | 1 | 0 | 0 | 1 | 1 | 1 |
| Masked Query | data > input | 1 | 1 | 1 | 0 | 0 | 1 |
| Masked Query | data ≥ input | 1 | 0 | 0 | 1 | 1 | 0 |
| Masked Query | data ≥ input | 1 | 1 | 1 | 0 | 0 | 0 |
| Masked Query | data ≠ input | 1 | 0 | 0 | 1 | 1 | 1 |
| Masked Query | data ≠ input | 1 | 1 | 1 | 0 | 1 | 1 |
| Masked Query | don't care | X | X | 0 | 0 | 1 | 0 |
| Masked-Addressed Write | X | 0 | X | undriven | undriven | X | X |
| Masked-Addressed Write | X | 1 | 0 | 0 | 1 | X | X |
| Masked-Addressed Write | X | 1 | 1 | 1 | 0 | X | X |

Figure 5A

| CamOp 29 | QueryOp 41 | Mask Register Bit 50 | DataIn Bit | CamBit 85 | CamBit* 87 | ComparisonOp 89 | Equality* 91 |
|---|---|---|---|---|---|---|---|
| Read | X | X | out | stored data | stored data* | 1 | X |
| Write | X | X | 0 | 0 | 1 | 1 | X |
| Write | X | X | 1 | 1 | 0 | 1 | X |
| Query | data = input | X | 0 | 0 | 1 | 0 | 0 |
| Query | data = input | X | 1 | 1 | 0 | 0 | 0 |
| Query | data < input | X | 0 | 0 | 1 | 0 | 1 |
| Query | data < input | X | 1 | 1 | 0 | 1 | 1 |
| Query | data ≤ input | X | 0 | 0 | 1 | 0 | 0 |
| Query | data ≤ input | X | 1 | 1 | 0 | 1 | 0 |
| Query | data > input | X | 0 | 0 | 1 | 1 | 1 |
| Query | data > input | X | 1 | 1 | 0 | 0 | 1 |
| Query | data ≥ input | X | 0 | 0 | 1 | 1 | 0 |
| Query | data ≥ input | X | 1 | 1 | 0 | 0 | 0 |
| Query | data ≠ input | X | 0 | 0 | 1 | 1 | 1 |
| Query | data ≠ input | X | 1 | 1 | 0 | 1 | 1 |
| Query | don't care | X | X | 0 | 0 | 1 | 0 |
| Read Mask Register | X | X | out | X | X | X | X |
| Write Mask Register | X | X | X | X | X | X | X |
| Addressed Read | X | X | out | stored data | stored data* | 1 | X |
| Addressed Write | X | X | 0 | 0 | 1 | 1 | X |
| Addressed Write | X | X | 1 | 1 | 0 | 1 | X |
| No Operation | X | X | X | X | X | X | X |
| Masked Write | X | 0 | X | X | X | 0 | X |
| Masked Write | X | 1 | 0 | 0 | 1 | 1 | X |
| Masked Write | X | 1 | 1 | 1 | 0 | 1 | X |
| Masked Query | X | 0 | X | 0 | 0 | 1 | n/a |
| Masked Query | data = input | 1 | 0 | 0 | 1 | 0 | 0 |
| Masked Query | data = input | 1 | 1 | 1 | 0 | 0 | 0 |
| Masked Query | data < input | 1 | 0 | 0 | 1 | 0 | 1 |
| Masked Query | data < input | 1 | 1 | 1 | 0 | 1 | 1 |
| Masked Query | data ≤ input | 1 | 0 | 0 | 1 | 0 | 0 |
| Masked Query | data ≤ input | 1 | 1 | 1 | 0 | 1 | 0 |
| Masked Query | data > input | 1 | 0 | 0 | 1 | 1 | 1 |
| Masked Query | data > input | 1 | 1 | 1 | 0 | 0 | 1 |
| Masked Query | data ≥ input | 1 | 0 | 0 | 1 | 1 | 0 |
| Masked Query | data ≥ input | 1 | 1 | 1 | 0 | 0 | 0 |
| Masked Query | data ≠ input | 1 | 0 | 0 | 1 | 1 | 1 |
| Masked Query | data ≠ input | 1 | 1 | 1 | 0 | 1 | 1 |
| Masked Query | don't care | X | X | 0 | 0 | 1 | 0 |
| Masked-Addressed Write | X | 0 | X | X | X | 0 | X |
| Masked-Addressed Write | X | 1 | 0 | 0 | 1 | 1 | X |
| Masked-Addressed Write | X | 1 | 1 | 1 | 0 | 1 | X |
| Multiple Write | X | X | 0 | 0 | 1 | 1 | X |
| Multiple Write | X | X | 1 | 1 | 0 | 1 | X |
| Masked-Multiple Write | X | 0 | X | X | X | 0 | X |
| Masked-Multiple Write | X | 1 | 0 | 0 | 1 | 1 | X |
| Masked-Multiple Write | X | 1 | 1 | 1 | 0 | 1 | X |

CONTENT-ADDRESSABLE MEMORY SYSTEM CAPABLE OF FULLY PARALLEL MAGNITUDE COMPARISONS

FIELD OF THE INVENTION

This invention relates to digital memories and more particularly to content-addressable, or associative, memories.

BACKGROUND OF THE INVENTION

In a Content-Addressable Memory (CAM), as distinguished from a conventional non-content-addressable memory, a data word is accessed by specifying a data value which is compared to at least part of the content of the word. For example, if a CAM system stores a personnel database and each word of CAM describes the attributes of a person such as name, age, height, and weight, all persons having a certain age could be found by comparing the desired age to the portion of each word which contains age data. In most CAM systems, all comparisons are done concurrently, or "in parallel". Parallel comparisons of a CAM system offer a major advantage over non-content-addressable memory because, in the latter case, all memory locations would need to be interrogated in a sequential fashion, thus requiring much more time to search the data.

The results of all the parallel comparisons are stored into a special memory which has gone by many names: flag bit, tag bit, match trigger, and response store. Thus, since each word has a comparison result, there is a flag bit associated with each word. Continuing with the above personnel database example, all words which contain an age parameter equal to the desired age will have their flag bit equal to '1' while those which are not equal will have their flag bit equal to '0'. Most CAM systems provide a scheme by which all words with a flag bit equal to '1' are read out of the memory. This usually requires a sequence of steps: finding a word with its flag bit equal to '1'; reading the data word out of the memory; outputting the data to another device for further processing; and turning off the flag bit so that subsequent reads will output different data words. This sequence may take more than one clock cycle, but, in the CAM system presented in this patent, all steps for a read operation occur in one clock cycle.

CAM systems commonly allow a sequence of comparison operations to be performed in order to provide greater flexibility in searching the stored data. Once again returning to the personnel database example, after the comparison operation on the age attribute has appropriately set of all flag bits, another comparison is performed on the height attribute. However, only words which have their flag equal to '1' before this comparison will have a possibility of having their flag set to '1' after this comparison. Thus, after these two comparisons have been performed, only words containing both the desired age and desired weight have their flag equal to '1'. A subsequent comparison could test for a desired height, and this process could continue for as many comparisons as desired. At each step, the new flag value is a function of both the old flag value and the comparison result. This process requires the ability to set all flags equal to '1' before the process starts.

In order to determine which bits in a word affect the outcome of a comparison, a mask register is usually provided. There is one mask register for the entire system and it has the same number of bits as a word of CAM. If, for example, a particular bit in the mask register has a value of '1', then the one-bit comparison performed on the corresponding bit in all words of CAM will affect the comparison results. Conversely, if the mask bit is '0', the one-bit comparison on corresponding bits will not affect the overall comparison results. In the personnel database example, a comparison on only the age parameter requires bits in the mask register corresponding to the age parameter bits to be set to '1', while all other bits in the mask register are set to '0'. Each parameter is stored in a portion of a word referred to as a "subfield".

Some CAM systems, such as U.S. Pat. No. 3,607,702 by Gardner, et. al., allow more than one flag bit.

This allows the CAM to execute a wider variety of algorithms. Caxton Foster, in his book, Content Addressable Parallel Processors, published by Van Nostrand Reinhold Company in 1976, describes several algorithms for content-addressable systems which require more than one flag bit per word.

Returning to the example of the personnel data base, if a search to discover all persons with weight greater than 145 pounds is required, a bit-sequential algorithm is usually employed. That is, the mask register is set so only one bit in the weight parameter affects the outcome of each word's comparison. Bits in the weight parameter are scanned from most significant to least significant and each step determines some words are greater-than and some words are less-than. The process is continued until all bit positions in the weight parameter have been tested. This type of algorithm is described in detail on page 61 of Caxton Foster's book and requires at least two flag bits per word. It is seen that the execution time of this algorithm is proportional to the number of bits to be scanned. This is a huge advantage over conventional memory because it would be necessary to scan each word and compare its weight parameter to 145. To reiterate, the above described CAM system performs this algorithm in time proportional to the number of bits to be scanned, while conventional memory systems require time proportional to the number of words to be scanned. There is, however, room for improvement. If each CAM word includes the appropriate hardware, a full greater-than comparison on the entire weight parameter can be performed in one clock cycle. This, of course, requires more complicated hardware since most CAM systems only allow testing for equality or inequality. The invention presented in this patent includes such hardware in each word of CAM.

With the inclusion of less-than and greater-than comparison capability, the personnel data base could be searched for persons with weight greater than 145 pounds in one clock cycle. A further improvement would be obtained if a one-clock-cycle search could be performed to find people with age less than 22 years, height greater than 74 inches, and weight greater than 145. This further complicates the hardware since all three comparisons must take place in parallel. This requires all three pieces of data (i.e. 22, 74, and 145) and the type of comparison to be performed on each subfield (i.e. greater-than, less-than, etc.). All people found to have these characteristics are in a subset of the entire set of people contained in the database. This subset could be saved for future use by allocating a flag to remember which people are in this particular subset. The subset could then be altered to include those words, or people, which pass the above test and pass an additional test for age greater than 18 years and height less than 76 inches. This new subset could overwrite the old subset by using the same flag bit, or it could use another flag bit and preserve the old subset. Thus, the total number of subsets that a CAM of this type could keep track of at any one instant in time is equal to the number of flag bits in each word. The operation of multiple subfield comparisons occurring in the same clock cycle is referred to as a "query" and is unique to the present patent.

Only one other patent is known to be able to perform less-than and greater-than type comparisons in one clock cycle. This is U.S. Pat. No. 3,320,592 by Rogers, et.al. entitled "Associative Memory System". This patent specifies three flag bits called $G_{FF}$, $L_{FF}$, and Active Flip-Flop. The Active Flip-Flop performs the same role as the special "data invalid" flag described above. $G_{FF}$ and $L_{FF}$ store the results of greater-than-or-equal-to and less-than-or-equal-to comparisons respectively. To define a subset of words within a range of values, both of these flip-flops need to be used. The Rogers patent does not allow a provision for keeping track of multiple subsets of the data or Boolean operations between such subsets. The Rogers patent does not allow multiple subfields within a word and thus does not lend itself to processing spatially distributed data. It does not include a means of "or-ing" flag bits together and thus requires the execution of a read cycle to determine that no data words are in the searched range of values. In order to test for the equality condition, two clock cycles must be used rather than one. Finally, the Rogers patent is designed in cryogenic logic circuitry which is completely different from the FET or CMOS technology used in the present patent application.

U.S. Pat. No. 3,389,377 by Cole, et.al. entitled "Content Addressable Memories" provides a means for computing less-than and greater-than comparisons, but requires a bit sequential search technique. It also suffers from having only one true flag bit, called a "Match Store", making it impossible to process more than one subset at a time. It also does not provide for multiple subfields within words or for an "or" of the flag bits.

TRW LSI Products, Inc. of La Jolla, Calif., a subsidiary of TRW, has published a preliminary specification for a "VHSIC Window Addressable Memory (WAM)". This integrated circuit can simultaneously perform eight greater-than and eight less-than comparisons every two clock cycles. Thus, it can handle eight "windows" at a time, and each window can be divided into a maximum of twelve subfields. This TRW product differs considerably from the CAM of the present patent. In the present patent, data is stored in the integrated circuit and queries are performed sequentially. In the TRW chip, query data (called windows by TRW) are stored in the chip and data is scanned sequentially. This difference may be summed up by stating the present patent performes operations which are data parallel and query sequential, while the TRW chip is query parallel and data sequential. Clearly, these chips perform different functions. The TRW chip is appropriate for applications where the desired search space is known in advance and data flows through the chip once. Thus it can act as a filter. The present patent is appropriate for applications where the data is constant and many different queries are performed on the same data. The TRW chip does not provide anything similar to the flag bits of the present patent and therefore cannot manipulate sets of data with the efficiency of the present invention.

The CAM of the present patent is able to test for either equality, less-than, less-than-or-equal-to, greater-than, greater-than-or-equal-to, or inequality on each subfield during one clock cycle. This set of operations shall be referred to herein as a "query comparison."

If many subsets have been formed, it would be useful to perform operations such as union and intersection on groups of subsets. For example, if three subsets were defined in the personnel database, it might be desirable to know which people are members of either subset 1 or subset 2 but are not members of subset 3. These types of operations are possible in the CAM presented here because a selectable Boolean operation can be performed on sets of flag bits. This Boolean operation can take place in a separate clock cycle or in the same clock cycle with a comparison operation and use the comparison result as input to the Boolean operation in the present invention.

For a CAM with all of the above properties, a more practical application would be in the area of processing spatially distributed data points. Consider an n-dimensional space sparsely populated with data points. Each word of CAM would represent one of the data points by storing its position in the n-space. Since position in n-space requires an n-tuple (if n=3, the 3-tuple could also be called an "ordered triple"), each word of CAM is required to store n numbers. Each of these numbers is analogous to one of the parameters attributed to a person in the above personnel database example. These parameters are referred to as "subfields" of the word of CAM. When, for example, a less-than operation is performed on both parameters in 2-space, or x-y plane, all data points in the CAM are tested to see if they lie in a particular quadrant of the space. If the comparison is $x<100$ and $y<50$, than the point (98,48) would lie in the quadrant while the point (102,30) would not lie in the quadrant. The result of this comparison would define a subset of the entire set of points and the members of this subset would be indicated by having a particular flag bit set to '1'. If another comparison such as $x>90$ and $y>45$ were performed to form another subset, and the intersection of these two subsets were found, a new subset would be generated such that only the points in the rectangular region $90<x<100$ and $45<y<50$ would be included in the subset. Thus, it is seen that this CAM can generate and manipulate regions in an n-dimensional space. Arbitrarily shaped regions could be generated by taking unions and intersections of various other regions. This CAM processing system can "query" an n-dimensional space in order to determine which data points lie in particular regions of the space. Once a region, or subset, is defined in this way, members of the set may be read from the CAM for other types of processing. A very useful function included here is the ability to determine whether any data points at all reside in a particular region in the space.

In a typical pattern recognition system, a large number of objects may be included as recognizable entities. An example of this would be the set of all types of airplanes and rockets. In a radar system, each type of aircraft generates a certain type of response to the radar. This radar profile is a complicated signal reflected by the aircraft. It is possible to extract characteristics, or features, from this signal. So, a transform occurs from the signal domain to the feature domain. This feature domain may have a very large number of dimensions and is usually called a "feature space". Each known type of aircraft has a radar profile which maps into this feature space and thus a sparsely populated n-dimensional space is formed. When an unidentified aircraft is seen by the radar, its radar profile is mapped into the feature space to see if it matches any of the known aircraft types. Since an exact match is very unlikely, the closest match is presumed to be the best guess of the unknown aircraft type. The conventional way to find the closest match would be to compare the unknown airplanes features to the features of each known aircraft in a one-by-one, or sequential, manner. For each comparison, the Euclidean distance between the known and unknown is computed. The smallest Euclidean distance indicates the best match.

In the CAM system described here, a sequential calculation of Euclidean distances is not required. Rather, in the feature space, an n-dimensional spherical region centered at the location of the unknown is formed. This region is expanded or shrunk until only one data point representing a known aircraft is contained in the region. The one left in the region must be the closest match to the unknown. An alternate scheme would be to create a large region around the location of the unknown which at least tells which of the known aircraft types are close. These close matches are then compared one-by-one to to the unknown to determine which is actually closest. In either case, the the CAM system's search time is at least approximately independent of the number of known airplane types, while the time required for a conventional search is proportional to the number of known airplane types. The number of known airplane types may be very large especially when a different orientation of the same airplane must be allocated different positions in the feature space.

The above search scheme could be applied to many areas of pattern recognition such as voice recognition, character recognition, and artificial vision. The CAM system described here could be applied to any problem which requires searching spatially distributed data.

The CAM system described here also includes many other useful features. One such feature is the inclusion of a special flag bit which designates the validity of the data in each CAM word. Since it is possible for the number of useful words of information stored in the CAM to be less than the total capacity of the CAM system, some words will contain invalid data. Invalid data should not be included in comparison operations. Also, when new data is written into the CAM, it must be placed into a word which contains only invalid data. When data is no longer needed, this special "data invalid" flag bit is set to '1' using the normal query operations. The signal coming from this flag bit is called FlagO. Flag bits are numbered from 0 to X−1, where X is the total number of flag bits. In this document, signal names will be italicized and a "*" appended to the end of a signal name indicates the signal is active low.

Another useful function is an "or" of flag bit values as they are generated. If the "or" of these flag bits is equal to '0', the subset represented by these flag bits is empty. This allows a region of an n-space to be interrogated for the presence of a data point without spending an additional clock cycle in an attempt to read a data point from the region.

A very useful feature presented here is the ability to use the mask register when performing a greater-than or less-than type of operation. This means that certain bits in a subfield are treated as if they were not present in the subfield. For example, if a subfield contains the bit pattern 10110010, the mask register contains 11001111, and the subfield is tested for a less-than 10001010, the comparison is found to be true. This is because the subfield data is treated as if it is 100010 rather than 10110010 (i.e. two bits deleted because of the value of the mask register) and it is compared to 101010 rather than 10001010. This feature is useful in sectioning up a large n-space into small overlapping ones by allowing several different sets of most significant bits to be associated with one set of low order bits.

The mask register can also be used to enable or disable writing to specific bits in the CAM. This is desirable if part of the contents of a word should remain unchanged while other bits are overwritten. This feature can be used for a parallel write into bits of many words. In this mode, words of CAM that have a specific flag equal to '1' will have some of their bits overwritten. This feature is necessary to allow the CAM to perform bit serial arithmetic. To see how these algorithms work, see Foster's book, page 80.

Also included in this patent is a scheme for dividing the entire CAM system into an array of integrated circuits. This requires a mechanism to determine which word in which chip responds to a "single word" operation such as read or write. The integrated circuit, or chip, described in this patent is designed using Field-Effect Transistors (FETs). The specific technology used here for the preferred embodiment is Complimentary Metal Oxide Silicon (CMOS) integrated circuit technology.

BRIEF DESCRIPTION OF THE DRAWINGS

The present invention will be better understood by reviewing this description given with reference to the following drawings.

DETAILED DESCRIPTION OF A PREFERRED EMBODIMENT

Overview of the CAM Integrated Circuit

The Content-Addressable Memory (CAM) described here is able to perform parallel comparisons between input data and stored data. During one clock cycle, every word in the memory is compared, in parallel, to the input data. In previously described CAM systems, data stored in the memory is generally limited to testing for either equality or inequality during a given clock cycle. The CAM presented here is able to test for either equality, less-than, less-than-or-equal-to, greater-than, greater-than-or-equal-to, or inequality during one clock cycle. Furthermore, each word stored in the CAM is composed of a multiplicity of subfields, each of which can perform an independent comparison. A comparison operation which takes one clock cycle is referred to as a "query" operation.

Figure 1:
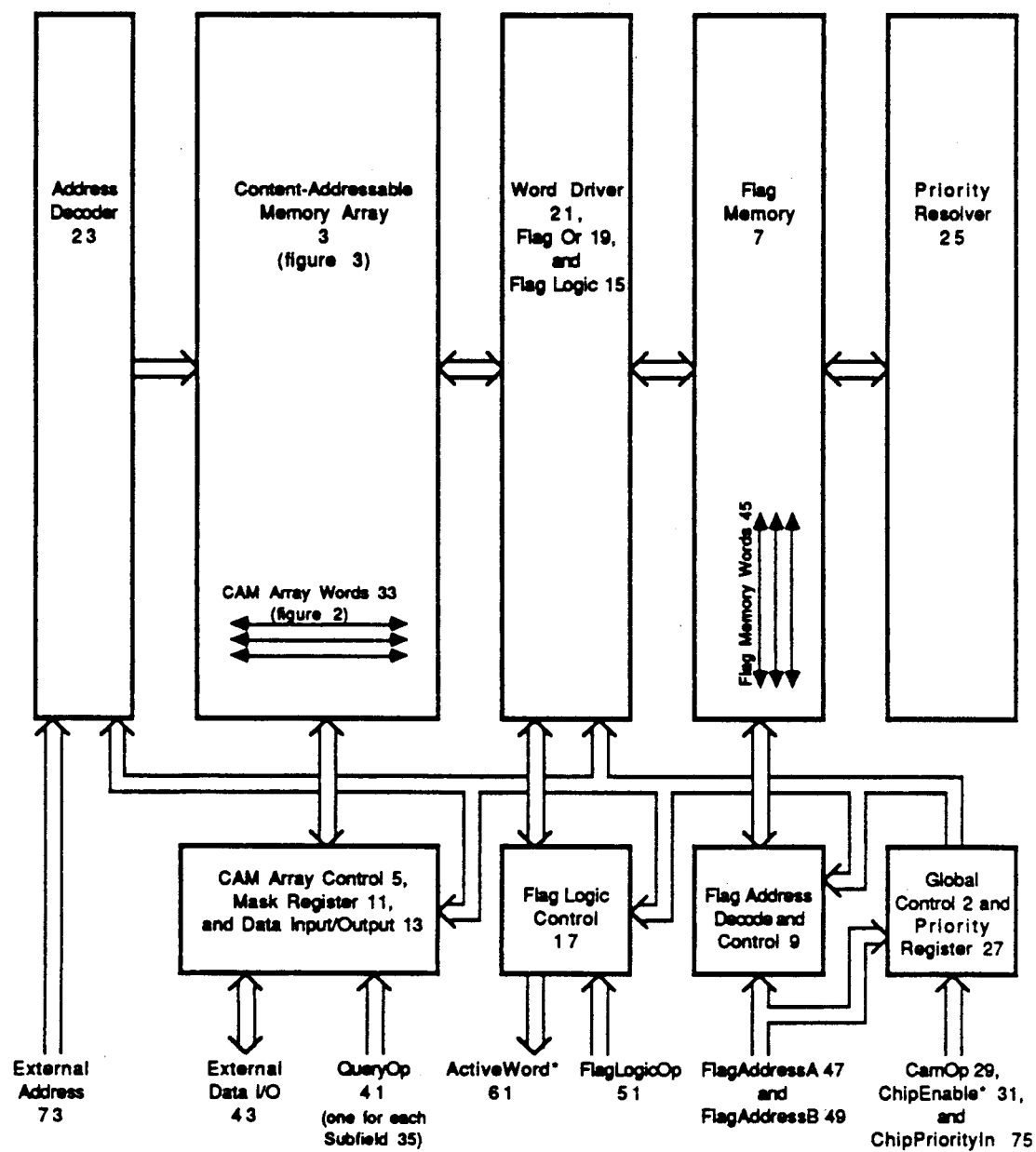
FIG. 1: Content-Addressable Memory Chip Block Diagram This is the top-level block diagram of the CAM integrated circuit which is the primary building block of the present invention.
Figure 2:
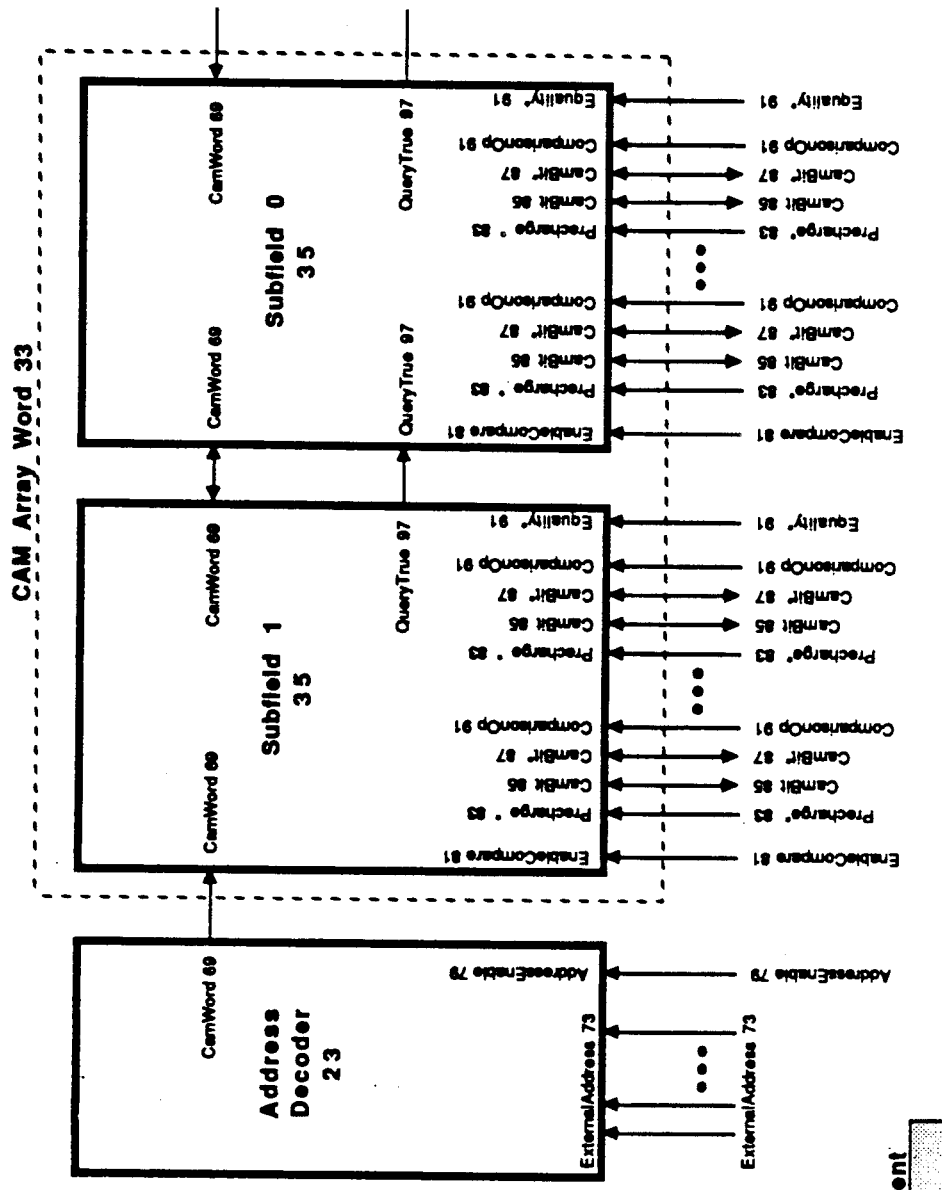
FIG. 2: Content-Addressable Memory Word The CAM integrated circuit contains a plurality of memory words. This figure is a block diagram of one of these words. Signals which pass into or out of the CAM Word are shown here.
Figure 2A:
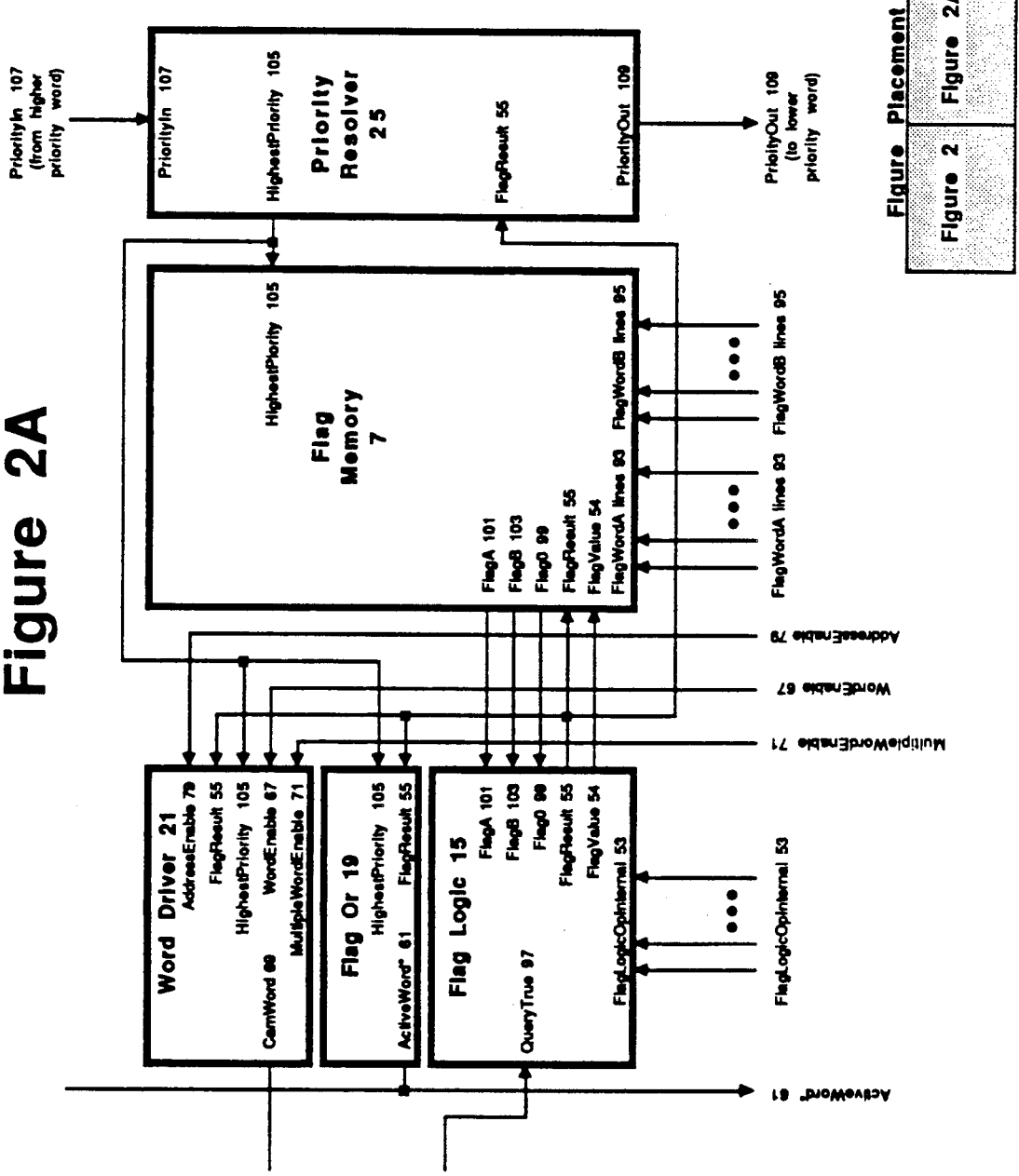

FIG. 1 shows the block diagram of one CAM integrated circuit 1. The main functional units of the CAM chip are: Global Control 2; CAM Array 3; CAM Array Control 5; Flag Memory 7; Flag Address Decode and Control 9; Mask Register 11; Data Input/Output 13; Flag Logic 15; Flag Logic Control 17; Flag Or 19; Word Driver 21; Address Decoder 23; Priority Resolver 25; and Priority Register 27. FIG. 2 shows all the components and signals associated with one CAM Word 28.

The CAM system described here can perform the following one clock cycle operations: Read; Write; Query; Read Mask Register; Write Mask Register; Addressed Read; Addressed Write; No Operation; Masked Write; Masked Query; Masked-Addressed Write; Multiple Write; and Masked-Multiple Write. The choice of operation for a particular clock cycle is encoded on the CamOp 29 input lines.

The Global Control 2 is responsible for controlling all other portions of the CAM chip 1. Its primary inputs are CamOp 29, which dictates the type of operation to be performed, and ChipEnable* 31, which indicates when operations are to begin. Another input, ChipSelect 30, is used during addressed operations to enable a particular chip.

Figure 3A:
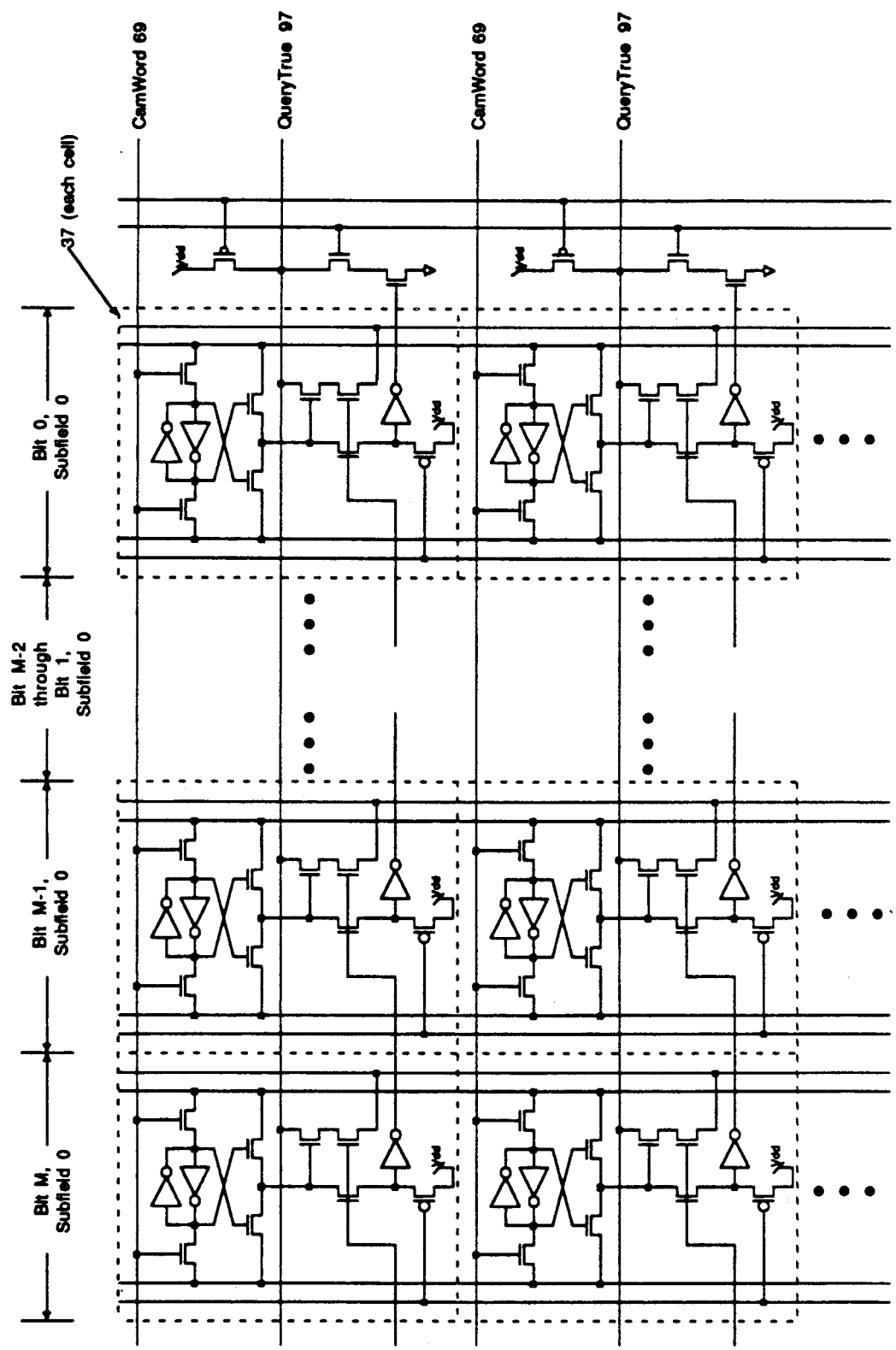
FIG. 3: Content-Addressable Memory Array Within the CAM integrated circuit, data is stored in the CAM Array. The data stored here can be interrogated through the use of query comparison operations.
Figure 3B:
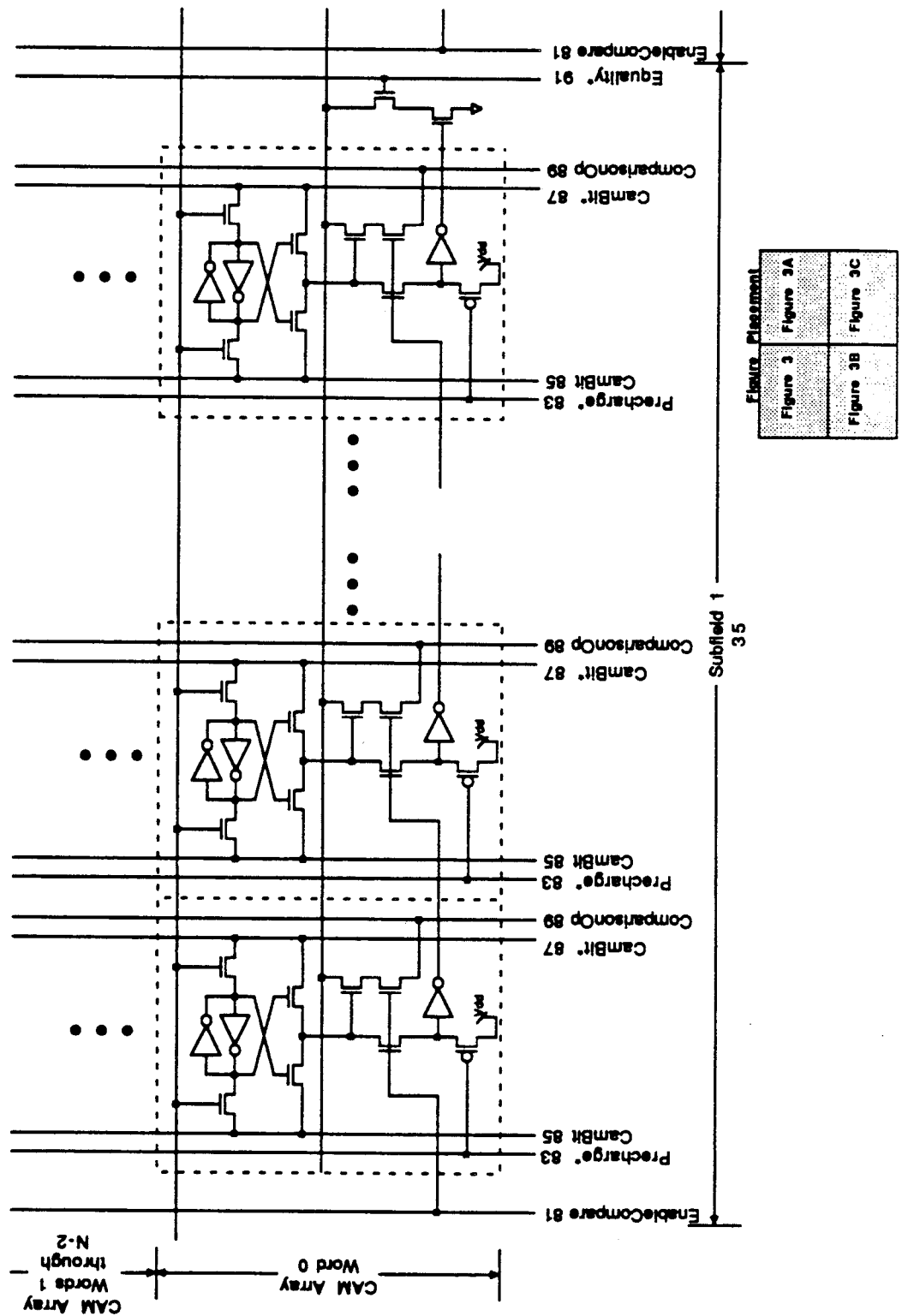
Figure 3C:
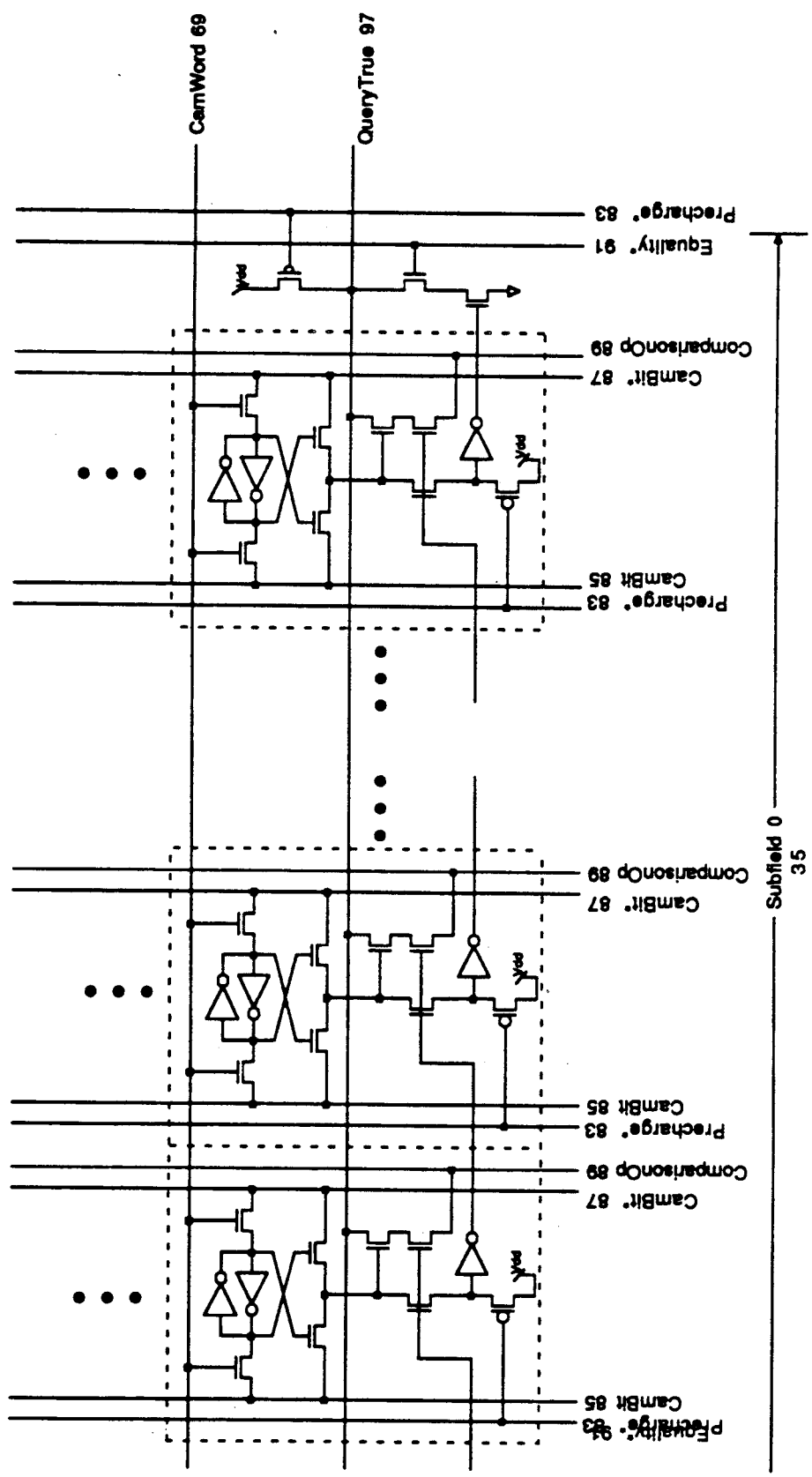
Figure 4:
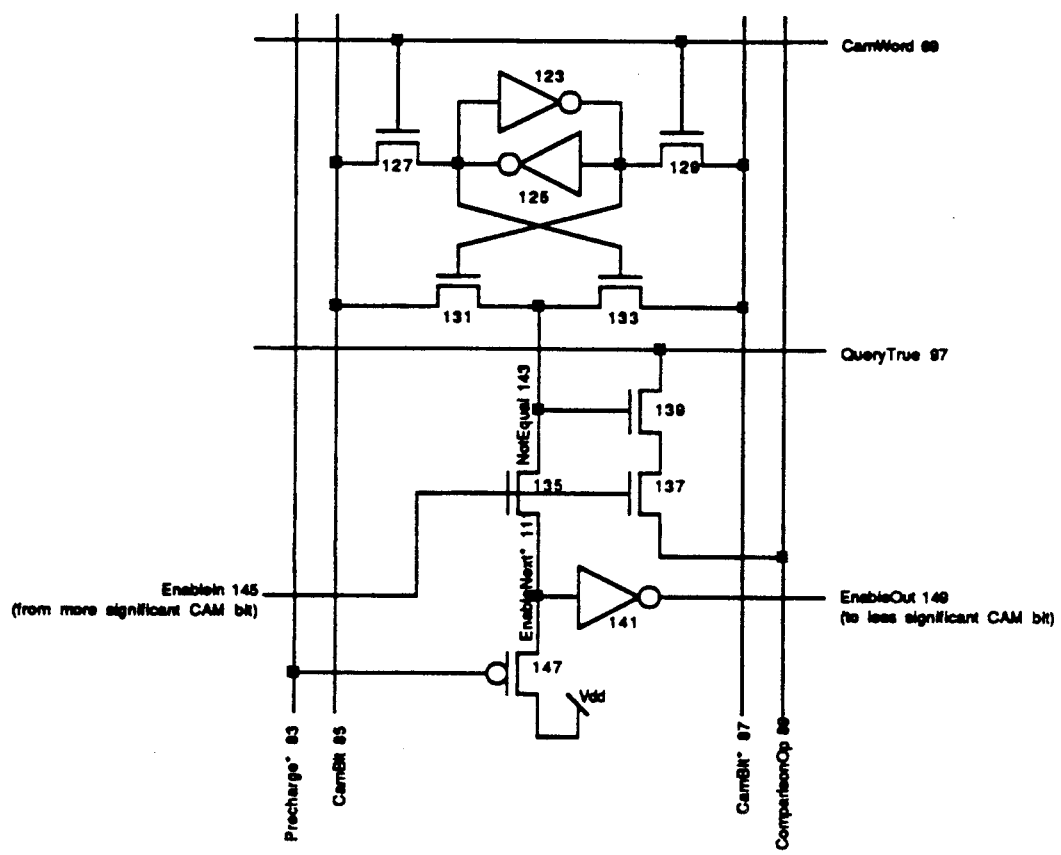
FIG. 4: CAM Bit Cell A This is one choice of circuit used in the CAM Array for storage of one bit of information.
Figure 5:
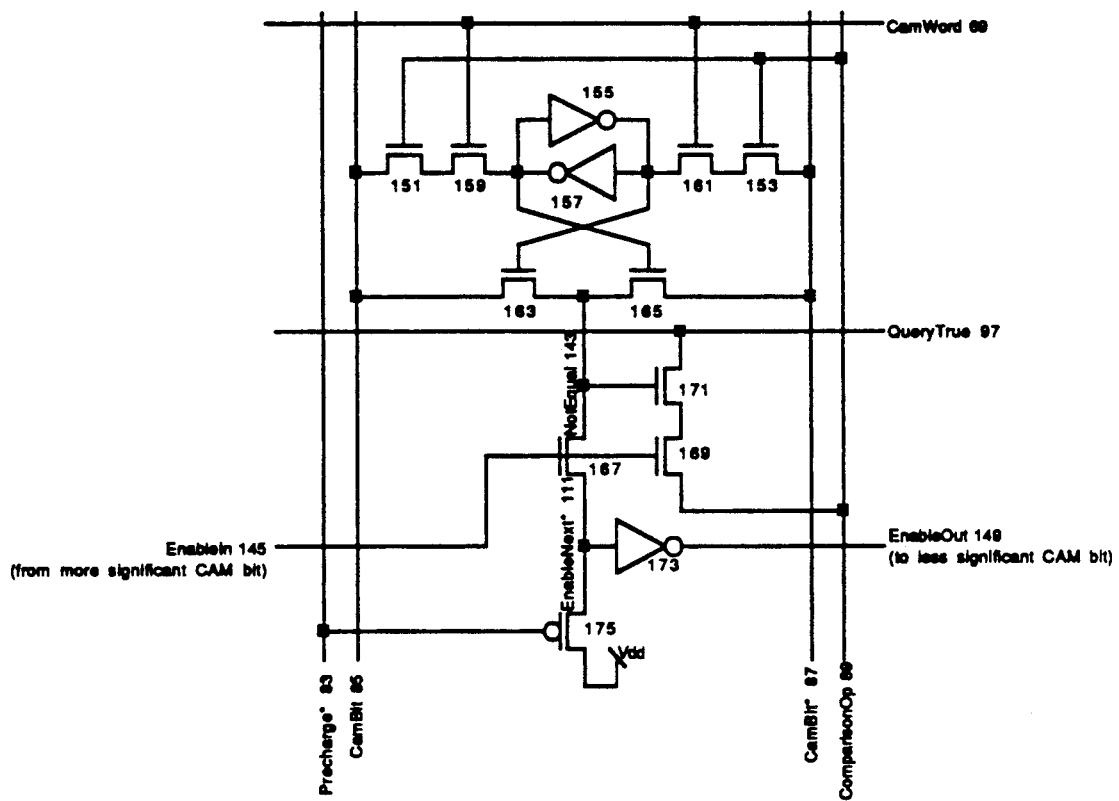
FIG. 5: CAM Bit Cell B This is another choice of circuit used in the CAM Array for storage of one bit of information.

The CAM Array 3, shown in detail in FIG. 3, is where data is stored and comparisons are performed. The CAM Array 3 is divided into a multiplicity of CAM Array Words 33; CAM Array Words 33 are divided into a multiplicity of Subfields 35; and Subfields 35 are divided into a multiplicity of CAM Bit Cells. Two types of CAM Bit Cells will be described. CAM Bit Cell A 37 is shown in FIG. 4 and CAM Bit Cell B 39 is shown in FIG. 5. The CAM Array 3 shown in FIG. 3 contains CAM Bit Cell A 37, but CAM Bit Cell A 37 could be replaced with CAM Bit Cell B 39 in order to add functions to the CAM chip 1. Each Subfield 35 stores a number which is compared to an input data field. Thus, if each word in the CAM Array 3 has three Subfields 35 of sixteen bits each, a total of 48 bits are input in parallel to the CAM chip 1. The number of bits in each Subfield 35 is not required to be the same, but would usually be equal for sake of symmetry. Since each Subfield 35 can perform an independent comparison, there is a set of signals, QueryOp 41, for each Subfield 35 which encoded the type of query the Subfield 35 is to perform.

The CAM Array Control 5 sends signals to the CAM Array 3 to dictate its function. It controls the receiving and sending of data bits to the CAM Array 3 as well as all necessary control signals. The CAM Array Control 5 is also responsible for controlling input and output through the External Data I/O Bus 43. Signals from the Global Control 2 section in addition to the QueryOp 41 inputs dictate the operation of the CAM Array Control 5.

Figure 10:
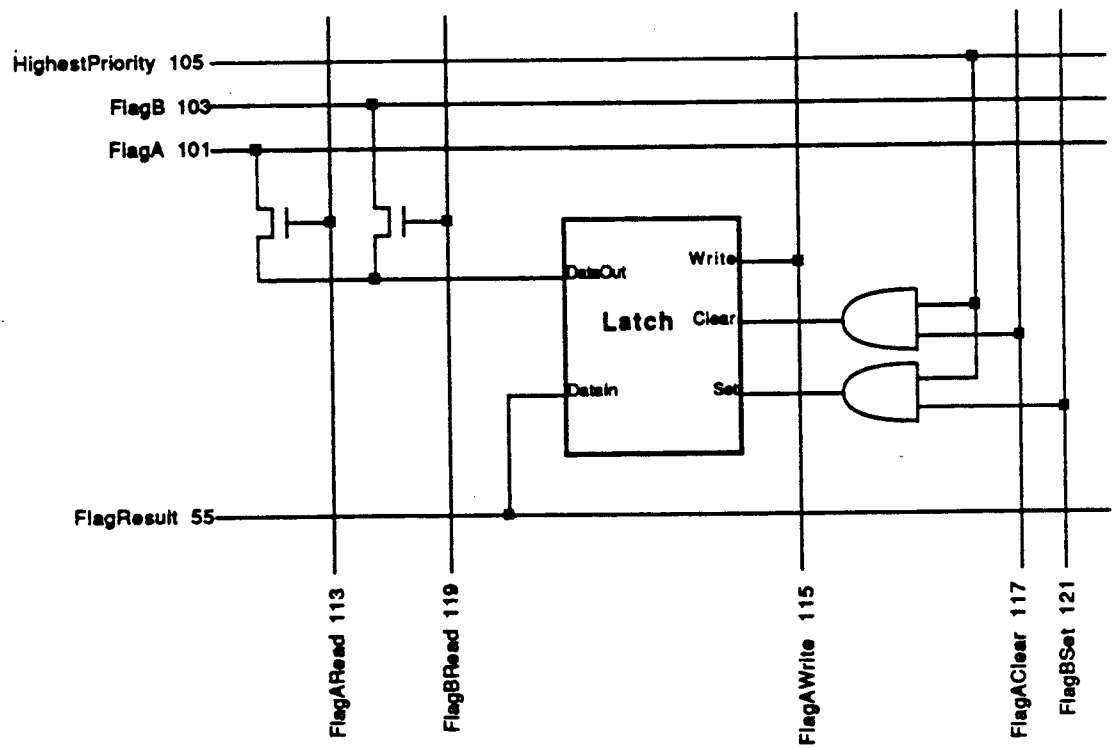
FIG. 10: Flag Memory Bit This is a circuit used to store one flag bit value.

Flag Memory 7 is the place where results of queries are stored. Since each CAM Word 28 produces a result for each query operation, each Flag Memory Word 45 contains one Flag Bit 46 which corresponds to one word in the CAM Array 3. Thus, in FIG. 1, CAM Array Words 33 are stacked vertically while Flag Memory Words 45 are stacked horizontally. So, one CAM Word 28 contains one full CAM Array Word 33 and one bit in each Flag Memory Word 45. Note that three types of words have been defined: CAM word 28, shown in FIG. 2; CAM Array Word 33, several of which are shown in FIG. 3; and Flag Word 45. Flag Memory 7 is a multiple-read-multiple-write memory. The exact detail of how many read ports and write ports depends on the particular implementation. An example implementation of a Flag Bit 46 having two read ports, one write port, one set port, and one clear port is shown in FIG. 10 and will be described later.

Externally supplied Flag Addresses are input to the Flag Address Decode and Control 9 portion of the chip. The number of Flag Addresses depend on the particular implementation, but the rest of the discussion will assume two Flag Addresses: FlagAddressA 47 and FlagAddressB 49. Each of these Flag Addresses 47,49 selects a Flag Memory Word 45 which will be used during the current clock cycle. This portion 9 of the chip 1 is responsible for generating all timing and control signals for the Flag Memory 7. Global Control 2 dictates the actions performed in this portion 9 of the chip 1.

The Mask Register 11 is an internal register which has one Mask Register Bit 50 for every bit position in a CAM Array word 33. This register can be written to and read from by using the appropriate types of clock cycles as dictated by the CamOp 29 input. The Mask Register 11 is used to designate which bit positions in the CAM Array Word 33 will be active during an operation. For example, if a Masked Query is to be performed, and a particular Mask Register 11 bit is a '0', each bit in that position of all CAM Array words 33 will be treated as "don't care". Conversely, if the Mask Register Bit is a '1', then the result of the query will depend on the values located in this bit position in the CAM Array Words 33. Note that many CAM operations come in both masked and unmasked form. In the unmasked form, the value of the Mask Register 11 does not matter.

The Data Input/Output portion 13 of the chip contains the sense amplifiers required to read data out of the CAM Array 3. It also contains drivers which drive data into the CAM Array 3 during a write or query operation and drives which send data to the outside world during a read operation.

Figures 6, 6A:
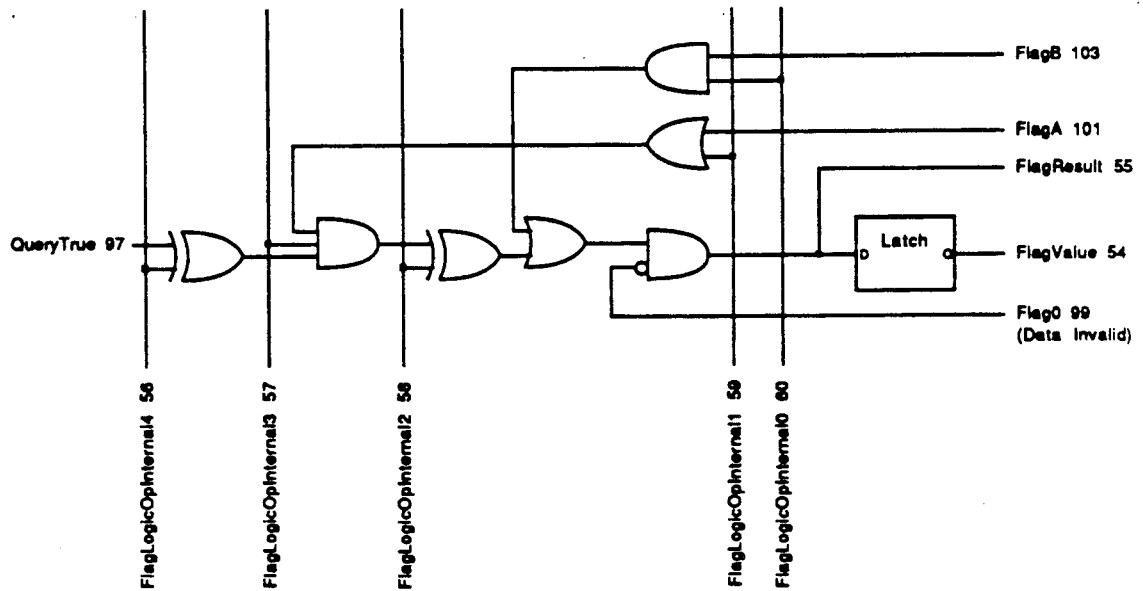
FIG. 6: Flag Logic This is a schematic and a truth table for logic which computes flag bit values.

Flag Logic 15 performs a selected boolean operation on the query result and the set of flag bits read from Flag Memory 7. The boolean operation for query operations is selected by the set of external signals FlagLogicOp 51. One possible implementation of Flag Logic 15 is shown in FIG. 6. FIG. 6 shows FlagLogicOpInternal 53 as the composite of five individual signals 56,57,58,59,60. The output of Flag Logic 15 is FlagResult 55 which is latched to form FlagValue 54. There is one copy of Flag Logic 15 in each CAM Word 28.

Flag Logic Control 17 dictates the operation the Flag Logic 15. During a query operation, this requires translating the set of external signals, FlagLogicOp 51, into the set of internal signals, FlagLogicOpInternal 53. However, during other types of operations, the output of Flag Logic 15 is usually required to be equal to a flag value. For the circuit shown in FIG. 6, a Read operation, for example, requires FlagLogicOpInternal 53 to have a binary value of 10001 which sets FlagResult 55 equal to the "and" of two flag bits.

Figure 7:
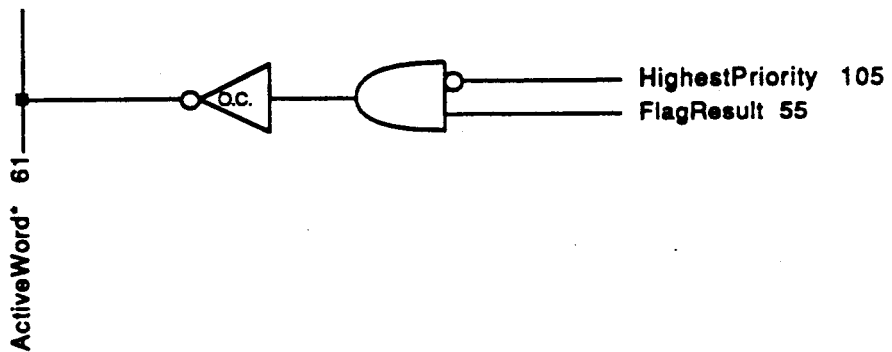
FIG. 7: Flag Or This is a schematic for logic which computes the "wired or" of flag values.

The Flag Or 19 circuit occurs once in each CAM Word 28 and one possible implementation is shown in FIG. 7. The entire set of Flag Or 19 circuits is responsible for performing the "or" of the outputs from all the Flag Logic 15 sections. This generates the external signals ActiveWord* 61 and ActiveWordOC* 62. Conceptually, this can be done with one big "wired or" as shown in FIG. 7 (where "O.C." means "open collector"), but may instead be implemented with a tree of or gates to increase performance.

Figure 8:
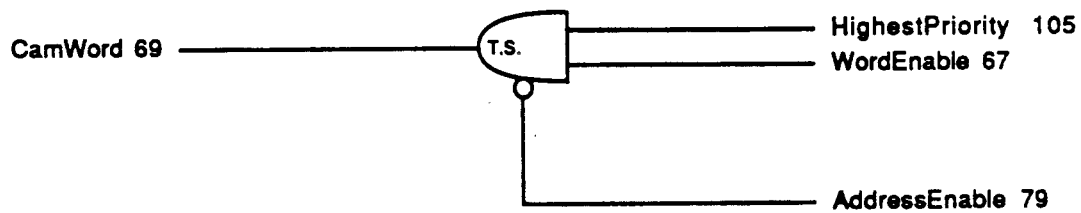
FIG. 8: Word Driver A This is one choice of circuit used in the CAM Array to drive the word line. This circuit is used if the design includes CAM Bit Cell A.
Figure 9:
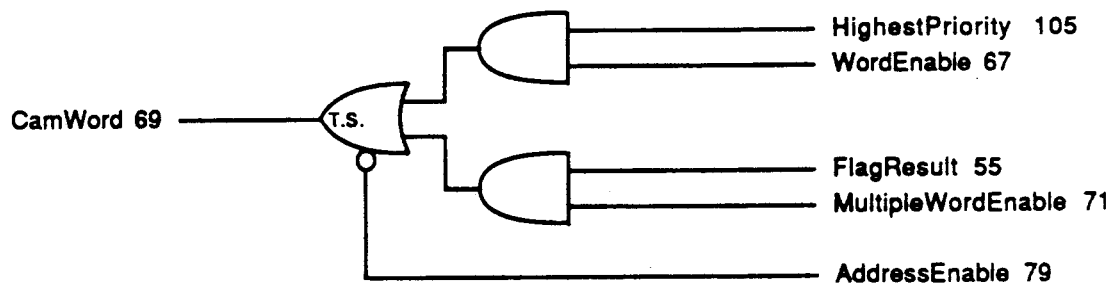
FIG. 9: Word Driver B This is another choice of circuit used in the CAM Array to drive the word line. This circuit is used if the design includes CAM Bit Cell B.

The Word Driver 21 circuit also appears once in every CAM Word 28. It is responsible for driving the word line in the CAM Array 3 for all operations which do not use the Address Decoder 23. If CAM Cell A 37 is used in the CAM Array 3, Word Driver A 63, shown in FIG. 8, is used in each CAM Word 28, Conversely, Word Driver B 65, as shown in FIG. 9, is used with CAM Cell B 39. If a single CamWord 69 is to be driven, WordEnable 67 must be activated. If many CamWord 69 lines are to be driven for either a Multiple Write or Masked-Multiple Write cycle, MultipleWordEnable 71 must be actived. If the optional Address Decoder 23 is not used, the tri-state driver in Word Driver A 63 or Word Driver B 65 is changed to a regular output type.

The Address Decoder 23 is a typical decoder found in conventional Random-Access Memory (RAM) chips. It is disabled for all operations except Addressed Read, Addressed Write, and Masked-Addressed Write. During these three types of operations, it takes as input an External Address 73 and selects one CAM Array Word 33 for either reading or writing from the External Data I/O Bus 43. This is an optional feature of the design because the CAM chip can function well without it. This is because the user of Content-Addressable Memory generally does not care which physical memory location contains a specific piece of data. However, the addition of this feature allows this CAM to also function as conventional memory.

The Priority Resolver 25 has one input and one output for each CAM Word 28. Each CAM Word 28 has a priority with respect to all other CAM Words 28 on the chip. During read and write operations, each CAM Word 28 reads a flag bit from Flag Memory 7 which is input to the Priority Resolver 25. The Priority Resolver 25 selects the highest priority word which has this flag bit equal to '1'.

The Priority Register 27 is an internal register with one bit corresponding to each word in Flag Memory 7. Since many CAM chips 1 will be used in parallel, each chip 1 has a priority in the entire system. A '1' in this register means that this chip 1 is the highest priority chip in the system with at least one bit in the corresponding Flag Memory Word 45 equal to '1'. A value of '0' indicates this is not the case. Bits in this register 27 are set at the end of a clock cycle according to the input ChipPriorityIn 75. ChipPriorityIn 75 is generated by an External Priority Resolver 77 similar to the on-chip circuit described above. This External Priority Resolver 77 takes as input ActiveWord* 61 from each chip 1 in the system. A signal equivalent to ActiveWord* 61 is also output from the chip, but this signal, ActiveWordOC* 62, has an open collector type of output which allows it to be tied to a "wired or" external to the chip.

CAM Word Description

FIG. 2 shows all signals and functional units within a CAM Word 28. The following control and data signals are broadcast to all CAM Words 28 in parallel: ExternalAddress 73; AddressEnable 79; EnableCompare 81; Precharge* 83; CamBit 85; CamBit* 87; ComparisonOp 89; Equality* 91; FlagLogicOpInternal 53; WordEnable 67; MultipleWordEnable 71, FlagWordA 93 lines; and FlagWordB 95 lines. The signals EnableCompare 81 and Equality* 91 occur once per Subfield 35 and the signals Precharge* 83, CamBit 85, CamBit* 87, and ComparisonOp 89 occur once for every bit in the CAM Array Word 33. The following signals occur once in every CAM Word 28: CamWord 69; QueryTrue 97; FlagResult 55; Flag0 99; FlagA 101; FlagB 103; and HighestPriority 105. The signal, ActiveWord* 61, is generated by performing a "wired or" on one bit from every CAM Word 28. The signals PriorityIn 107 and PriorityOut 109 are a "daisy chain" from one CAM Word 28 to the next. Thus, for example, PriorityOut 109 from one CAM Word 28 is connected to PriorityIn 107 of the next lower priority CAM Word 28 and so on.

A CAM Array Word 33 is the place within a CAM Word 28 where one piece of user data is stored and comparisons are performed. Each CAM Array Word 33 is split into a multiplicity of Subfields 35. Each Subfield 35 stores one number on which a comparison can be performed. Thus, a piece of user data is an n-tuple of unsigned integers. FIG. 2 shows only two Subfields 35 in the CAM Array Word 33, but any number can be included in a particular implementation. Two signals, CamWord 69 and QueryTrue 97, run the entire length of the CAM Array Word 33. CamWord 69, when activated in a particular word, means that word is to be read or written. The result of a query operation is the signal QueryTrue 97. QueryTrue 97 is precharged active and allowed to float undriven during a query operation. If the comparison performed in one Subfield 35 is "false", QueryTrue 97 is pulled down to ground indicating that the result of this word's query operation is false.

FIG. 3 is a very detailed schematic of one possible implementation of an entire CAM Array 3 and shows how one instance of both CamWord 69 and QueryTrue 97 run the entire length of each CAM Array Word 33. Each Subfield 35 is a row of identical CAM Bit Cells 37,39 and FIG. 3 shows both Subfields 35 as storing M+1 bits of information. Each bit position, or column, in each Subfield 35 is controlled by four signals: Precharge* 83, CamBit 85, CamBit* 87, and ComparisonOp 89. During query operations, all CAM Bit Cells 37,39 in a particular column perform the same operation and are all controlled in parallel with the same signals. CamBit 85 and CamBit* 87 are a differential signal pair used to transfer one bit of data to and from a column of Cam Bit Cells 37,39 for read, write, and query operations. These two signals 85,87 are usually driven in a complimentary fashion. Precharge* 83 is used to pull up, or precharge, an internal node, EnableNext* 111, within each CAM Bit Cell 37,39. This is done while ChipEnable* 31 is inactive in preparation for a query cycle. ComparisonOp 89 is responsible for determining which type of comparison is performed during a query cycle. The value of ComparisonOp 89 is set according to input data, Mask Register 11 data, QueryOp 41, and CamOp 29. ComparisonOp 89 can also be used to control writing to a column of CAM Bit Cells 37,39. The signal, Equality* 91, occurs once in each Subfield 35 and is active during query cycles where QueryOp 41 is set to one of the following conditions: equal; less-than-or-equal-to; or greater-than-or-equal-to.

Two specific examples of CAM Bit Cells 37,39 are shown in FIGS. 4 and 5. CAM Bit Cell B 39, shown in FIG. 5 can perform all the previously stated one cycle operations. Cam Bit Cell A 37 cannot perform Multiple Write or Masked-Multiple Write but has fewer transistors than CAM Bit Cell B 39.

As shown in FIG. 2, CamWord 69 can be driven from two sources: Address Decoder 23 and Word Driver 21. During Addressed Read cycles, Addressed Write cycles, and Masked-Addressed Write cycles, one CamWord 69 line is driven active by the Address Decoder 23 while all other CamWord 69 lines remain inactive. The one active CamWord 69 is selected by decoding the External Address 73 in a manner similar to that found in conventional RAM chips. The Address Decoder 23 is enabled by the signal AddressEnable 79, which is generated in Global Control 2.

During Read cycles, Write cycles, and Masked Write cycles, one CamWord 69 line is driven active by a Word Driver 21 while all others remain inactive. For these operations, all Word Drivers 21 on the chip are enabled by the activation of WordEnable 67 which is generated in Global Control 2.

Only one CamWord 69 will be activated because only one CAM Word's 69 HighestPriority 105 will be active. During these operations, MultipleWordEnable 71 is inactive, so the value of FlagA 101 does not affect CamWord 69. Circuits for Word Driver 21, Word Driver A 63 and Word Driver B 64, are shown in FIG. 8 and FIG. 9, respectively.

During Multiple Write cycles and Masked-Multiple Write cycles, several CamWord 69 lines can be enabled at the same time. This allows external data to be written into many CAM Words 28 in only one clock cycle. Generally, the Masked-Multiple Write is used for this purpose because only a portion of the data stored in each selected CAM Word 28 is overwritten with new data. For these operations, all Word Drivers 21 on the chip are enabled by the activation of MultipleWordEnable 71 which is generated in Global Control 2. The value FlagResult 55 is generated, and each word where this value is a '1', CamWord 69 will be activated.

During Query cycles, Masked Query cycles, No Operation cycles, Read Mask Register cycles, and Write Mask Register cycles, CamWord 69 is unused and so is kept is the inactive state.

Flag Logic 15 performs a selected boolean operation on FlagA 101, FlagB 103, FlagO 99, and QueryTrue 97 and generates FlagResult 55 and FlagValue 54. FlagA 101, FlagB 103, and FlagO 99 are read from Flag Memory 7 and QueryTrue 97 comes from the CAM Array Word 33. The boolean operation is selected by the signals FlagLogicOpInternal 53. Flag Logic 15 is used primarily during either Query or Masked Query cycles to generate a new flag value. One possible implementation for Flag Logic 15 is shown in FIG. 6 with a truth table which describes the logical value of FlagResult 55 as a function of FlagLogicOpInternal 53. In this implementation of Flag Logic 15, if, for example, FlagLogicOpInternal 53 is set to 01111, FlagResult 53 is set according to the boolean function "(FlagO)[(QueryTrue*)+(FlagB)]", which means 'or' together FlagB 103 and the inverse of QueryTrue 97, then 'and' this result with FlagO 99.

A CAM Word 28 contains one bit in each Flag Word 45. Therefore, the number of bits in a Flag Word 45 is equal to the number of CAM Words 28. In FIG. 2, FlagA 101, FlagB 103, and FlagO 99 are bits read out of the Flag Memory 7 and FlagResult 55 is the bit which can be written into Flag Memory 7. All bits in a Flag Memory Word 45 are controlled in parallel by FlagWordA 93 lines and FlagWordB 95 lines. FlagAddressA 47 and FlagAddressB 49 are externally supplied signals decoded to select which Flag Words 45 will be chosen for purposes of reading and writing. FlagWordA 93 lines include: FlagARead 113, FlagAWrite 115, and FlagAClear 117; while FlagWordB 95 lines include: FlagBRead 119 and FlagBSet 121. These signals are shown in detail in FIG. 10.

During a Query or Masked Query operation, FlagA 101, FlagB 103, and FlagO 99 are read out of Flag Memory 7 in parallel and input to Flag Logic 15. Flag Logic 15 generates a new flag value, FlagResult 55, which is written into the Flag Word 45 from which FlagA 101 was read. During a Read operation, one CAM Word 28 is selected for reading by the assertion of its HighestPriority 105 signal, which comes from the Priority Resolver 25. This signal, together with FlagAClear 117, selects one bit in the Flag Word 45 selected by FlagAddressA 47 to be reset. Write and Masked Write operations also select a CAM Word 45 through the same mechanism and allow a flag bit to be set by asserting FlagBSet 121.

The Flag Or 19 circuit, as shown in FIG. 7, simply "ands" FlagResult 55 with the inverse of HighestPriority 105 to generate a condition to pull down ActiveWord* 61. During query cycles, HighestPriority 105 in each CAM Word 28 is equal to '0' and so leaves the output of the "and" gate as a function of only FlagResult 55. However, during a Read cycle, the one CAM Word 28 with its HighestPriority 105 signal active will not be included in determining the value of ActiveWord* 61. This is important because, during a Read cycle, a Flag Word 45 is selected and input into the Priority Resolver 25 which selects one CAM Array Word 33 for reading. ActiveWord* 61 should only be pulled down if some other word in the CAM chip 1 also has this flag active. Thus, ActiveWord* 61 will be pulled down during a Read cycle if another word (in addition to the one being read) can be read out of the chip 1.

Figure 11:
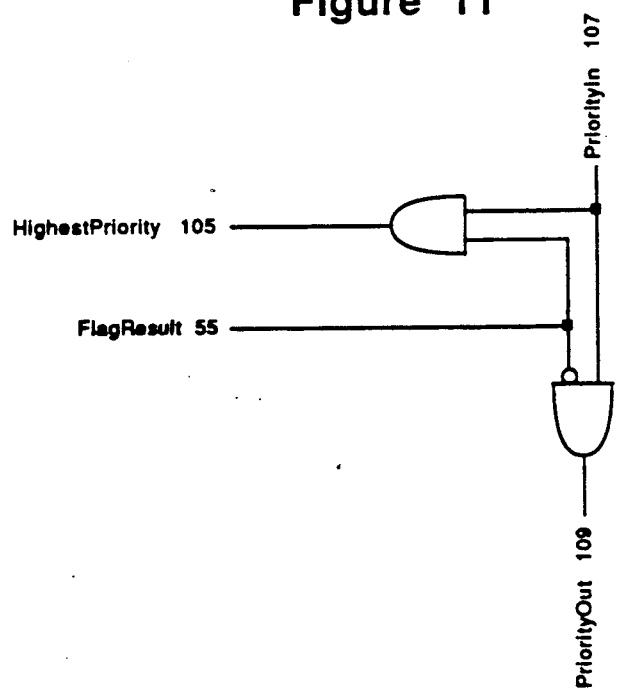
FIG. 11: Priority Resolver Bit This is a circuit for a one-bit section of the Priority Resolver needed on the CAM chip.

A simple implementation of the portion of the Priority Resolver 25 included in a CAM Word 28 is shown in FIG. 11. At the beginning of a Read, Write, or Masked Write cycle, PriorityIn 107 at the highest priority CAM Word 28 is active. This allows the highest priority word to assert its HighestPriority 105 signal if its FlagResult 55 is equal to '1'. If this is not the case, this word activates its PriorityOut 109 signal which is equivalent to PriorityIn 107 of the next most significant CAM Word 28. This daisy chain process continues until either some word's HighestPriority 105 signal becomes active or all the words have been rippled through. This implementation would be very slow since a signal may need to ripple through all the words on the chip 1. It is included here for illustrative purposes only. A better circuit utilizing a tree structure is required for higher circuit performance. Also, care must be taken to not glitch any CamWord 69 lines due to glitches on any HighestPriority 105 signals. This requires either careful timing of WordEnable 67 or a means of insuring only low-to-high transitions on FlagResult 55 signals during a read or write cycle. This latter choice is attractive if "domino logic" CMOS circuit design techniques can be used in the design of the CAM Word 28.

CAM Bit Cells

Two CAM Bit Cells 37, 39 will be presented here. These are identified as CAM Bit Cell A 37 and CAM Bit Cell 39 and appear in FIGS. 4 and 5, respectively. CAM Bit Cell B 39, when included in the design, can perform all the previously stated one-cycle CAM operations while CAM Bit Cell A 37 cannot perform Multiple Write or Masked-Multiple Write. Since CAM Bit Cell A 37 is simpler, it will be described first.

CAM Bit Cell A 37, as shown in FIG. 4, requires fourteen transistors in its circuit. The two back-to-back inverters 123, 125 and the two pass transistors 127, 129 make up the memory portion of CAM Bit Cell A 37. Data is read from the memory of precharging CamBit 85 and CamBit* 87 to $V_{DD}$, allowing them to float, and then turning on the pass transistors 127, 129 by asserting CamWord 69. Data is written into the cell by driving CamBit 85 and CamBit* 87 with the desired data and then turning on the pass transistors 127, 129.

A one-bit comparison is performed in the cell 37 by transistors 131, 133 and generates NotEqual 143. Data stored in the cell 37 is placed at the gates of these transistors 131, 133 by the two inverters 123, 125. Comparison data is placed on the differential signal pair CamBit 85 and CamBit* 87. As an example, if a '1' is stored in the cell 37, transistor 133 is on, while transistor 131 is off. In this case, the data bit from CamBit* 87 is passed through transistor 133 to become the signal NotEqual 143. If CamBit* 87 is a '0', NotEqual 143 will be a '0' which means the stored bit and the comparison bit are equal. If NotEqual 143 is equal to '1', the stored bit is not equal to the comparison bit.

When a query process is performed, bits in each Subfield 35 are sequentially tested, starting with the Most Significant Bit (MSB). To initiate the comparison process, EnableIn 145 at the MSB in each Subfield 35 becomes active. Each CAM Bit Cell A 37 at the MSB location sees its EnableIn 145 become active. EnableIn 145 becoming active turns on transistor 135 and transistor 137. If NotEqual 143 in this cell is a '1', indicating the stored bit is not equal to the comparison bit, the value on ComparisonOp 89 passes through transistor 137 and transistor 139 to the signal QueryTrue 97. Since QueryTrue 97 is precharged to a value of '1', a '1' value of ComparisonOp 89 will not cause any effect on QueryTrue 97, but a value of '0' on ComparisonOp 89 can cause QueryTrue 97 to be pulled down. A value of '1' on NotEqual 143 will not effect EnableNext* 111 because it is precharged to '1' by transistor 147 before comparisons begin to occur. If NotEqual 143 is equal to '0', transistor 139 is off, and, when EnableIn 145 becomes active, EnableNext* 111 is pulled down to a value of '0'. With transistor 139 off, the value of ComparisonOp 89 cannot affect QueryTrue 97. When EnableNext* 111 is pulled down, the output of inverter 141 switches from '0' to '1' and activates EnableOut 149, which is EnableIn 145 of the next most significant bit.

If, during a Masked Query operation, a bit position has its Mask Register 11 bit equal to '0', all bits in that bit position do not affect the results of the query operation. This is achieved by driving CamBit 85 and CamBit* 87 both to a value of '0', rather than driving them in the normal differential mode. This causes NotEqual 143 to always have a value of '0' since either transistor 131 or transistor 133 must be on and pass a value of '0'. As described above, a value of '0' for NotEqual 143 always causes the next most significant cell to be enabled by turning on EnableOut 149 and also inhibits ComparisonOp 89 from having any affect on QueryTrue 97.

CAM Bit Cell B 39 has all of the transistors of CAM Bit Cell A 37 plus two more 151, 153. These two transistors 151, 153 allow CAM Bit Cell B 39 to perform Masked-Multiple Write cycles and make use of Multiple Write cycles. The two back-to-back inverters 155, 157 and the four pass transistors 151, 153, 159, 161 make up the memory portion of CAM Bit Cell B 39. Data is read from the memory by precharging CamBit 85 and CamBit* 87 to $V_{DD}$, allowing them to float, and then turning on the pass transistors 151, 153, 159, 161 by asserting CamWord 69 and ComparisonOp 89. Data is written into the cell by driving CamBit 85 and CamBit* 87 with the desired data and then turning on the pass transistors 151, 153, 159, 161.

Just as in CAM Bit Cell A 37, a one-bit comparison is performed in CAM Bit Cell B 39 by transistors 163, 165 and generates NotEqual 143. Data stored in the cell 39 is placed at the gates of these transistors 163, 165 by the two inverters 155, 157. Comparison data is placed on the differential signal pair CamBit 85 and CamBit* 87. As an example, if a '1' is stored in the cell 39, transistor 165 is on, while transistor 163 is off. In this case, the data bit from CamBit* 87 is passed through transistor 165 to become the signal NotEqual 143. If CamBit* 87 is a '0', NotEqual 143 will be a '0' which means the stored bit and the comparison bit are equal. If NotEqual 143 is equal to '1', the stored bit is not equal to the comparison bit.

The query process for CAM Bit Cell B 39 is identical to that of CAM Bit Cell A 37. When a query process is performed, bits in each Subfield 35 are sequentially tested, starting with the Most Significant Bit (MSB). To initiate the comparison process, EnableIn 145 at the MSB in each Subfield 35 becomes active. Each CAM Bit Cell A 37 at the MSB location sees its EnableIn 145 become active. EnableIn 145 becoming active turns on transistor 167 and transistor 169. If NotEqual 143 in this cell is a '1', indicating the stored bit is not equal to the comparison bit, the value on ComparisonOp 89 passes through transistor 169 and transistor 171 to the signal QueryTrue 97. Since QueryTrue 97 is precharged to a value of '1', a '1' value of ComparisonOp 89 will not cause any effect on QueryTrue 97, but a value of '0' on ComparisonOp 89 can cause QueryTrue 97 to be pulled down. A value of '1' on NotEqual 143 will not effect EnableNext* 111 because it is precharged to '1' by transistor 175 before comparisons begin to occur. If NotEqual 143 is equal to '0', transistor 171 is off, and, when EnableIn 145 becomes active, EnableNext* 111 is pulled down to a value of '0'. With transistor 171 off, the value of ComparisonOp 89 cannot affect QueryTrue 97. When EnableNext* 111 is pulled down, the output of inverter 173 switches from '0' to '1' and activates EnableOut 149, which is EnableIn 145 of the next most significant bit.

Just as in CAM Bit Cell A 37, if, during a Masked Query operation, a bit position has its Mask Register 11 bit equal to '0', all bits in that bit position do not affect the results of the query operation. This is achieved by driving CamBit 85 and CamBit* 87 both to a value of '0', rather than driving them in the normal differential mode. This causes NotEqual 143 to always have a value of '0' since either transistor 163 or transistor 165 must be on and pass a value of '0'. As described above, a value of '0' for NotEqual 143 always causes the next most significant cell to be enabled by turning on EnableOut 149 and also inhibits ComparisonOp 89 from having any affect on QueryTrue 97.

CAM Bit Cell B 39 can also perform a Masked-Multiple Write operation. This is done by setting ComparisonOp 89 in each bit position equal to the Mask Register Bit 50 in the same position and placing differentially data on CamBit 85 and CamBit* 87. Thus, if the Mask Register 50 is equal to '0', the pass transistors 151, 153 are off and all cells 39 in that bit position are protected from writing. Conversely, if the Mask Register Bit 50 is equal to '1', the pass transistors 151, 153 are on and all cells 39 in that bit position which have CamWord 69 active are written into. During a Multiple Write Cycle, ComparisonOp 89 is set to '1' and therefore enables writing to all CAM Bit Cells 39 in all CAM Array Words 33 which have CamWord 69 active.

CAM System Interconnection

Figure 12:
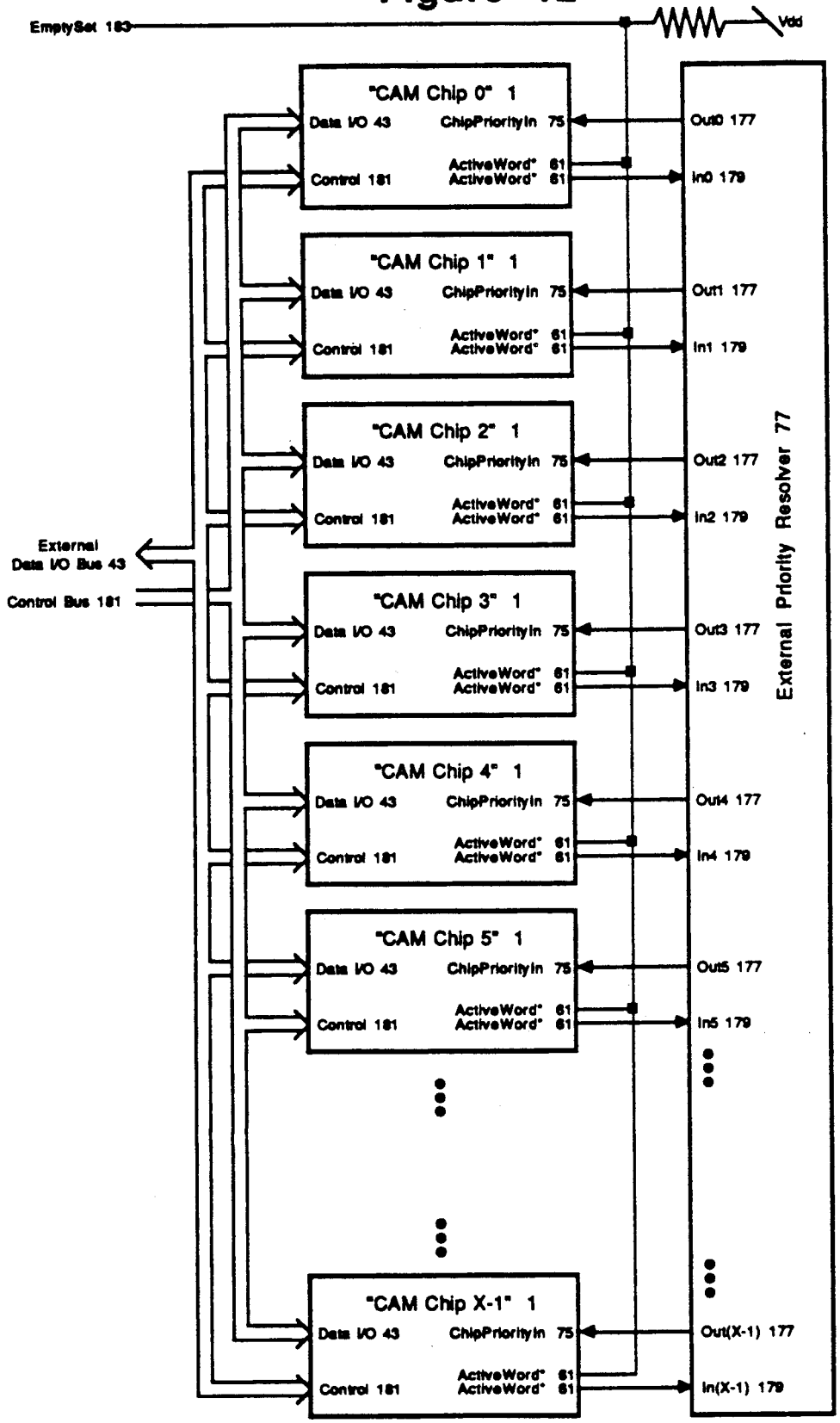
FIG. 12: CAM System This is a block of an entire CAM system. It shows a multiplicity of CAM chips and how they are linked together into a system.

The entire CAM system is shown in FIG. 12. It shows a total of X CAM chips 1, numbered 0 through X−1. It also shows how the External Priority Resolver 77 is connected to the CAM chips 1. The External Priority Resolver 77 has one output 177 and one input 179 per CAM chip 1 as described earlier. The External Data I/O Bus 43 is common to all CAM chips 1 in the system. The Control 181 signals are also bussed to all CAM chips 1 in the system. The Control Bus 181 includes the following signals: CamOp 29; ChipSelect 30; ChipEnable* 31; ChipPriorityIn 75; Flag Addresses 47, 49; FlagLogicOp 51; QueryOp 41; and External Address 73.

In order to determine if a subset designated by a flag bit is empty, all ActiveWordOC* 61 signals from all chips 1 in the system need to be "wire-ored" together to form EmptySet 183. For example, if the result of a query produces a FlagResult 55 equal to '1' in any CAM chip 1 in the system, that CAM chip's 1 ActiveWordOC* 61 will be active (equal to '0'), and this will cause EmptySet 181 to be inactive, or have the value '0'. Since an equivalent signal, ActiveWord* 61, is used as an input to the External Priority Resolver 77, both ActiveWord* 61 and ActiveWordOC* 62 must be output from the chip, and ActiveWordOC* 62, which is used for the "wired-or" to form EmptySet 181, must have an open collector type of output.

Read Cycle Timing

Figure 13:
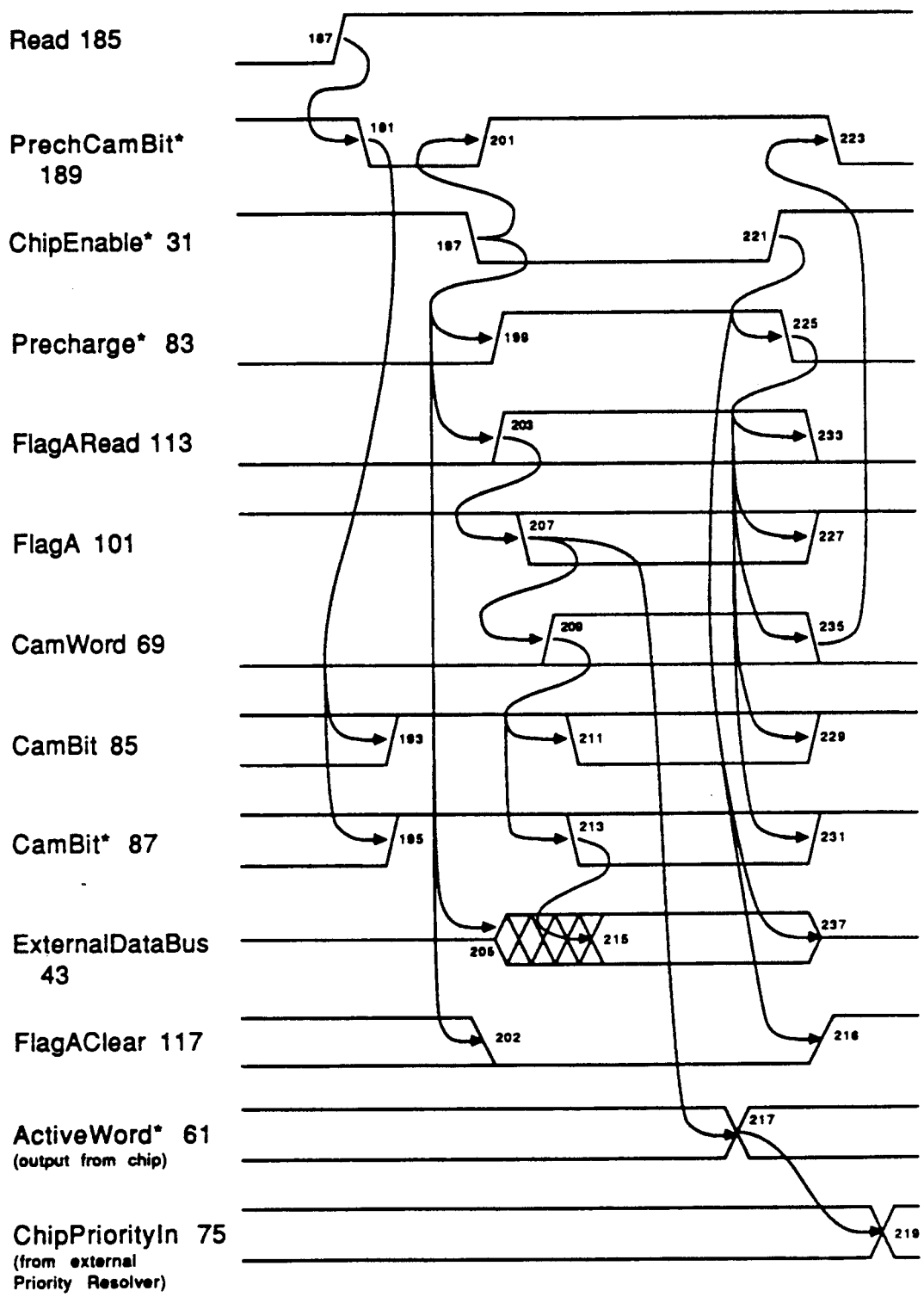
FIG. 13: Read Cycle Timing This is the signal timing which occurs when the CAM chip performs a read operation.

A Read Cycle is an operation which reads one word of data from the CAM chip 1 in one clock cycle. This Read operation selects a Flag Bit Word 45 through the use of a flag address input, FlagAddressA 93, then uses the Priority Resolver 25 to find the highest priority flag bit in this word 45 which is on, then reads the word of data out of the CAM Array 33 which corresponds to this highest priority flag bit. The timing diagram for a Read Cycle is shown in FIG. 13.

The signal Read 185 is a control signal decoded from CamOp 29, a set of external control signals which encode the operaton the CAM chip is to perform. Read 185 must be asserted an appropriate setup time prior to ChipEnable* 31 becoming active to allow all CamBit 85 and CamBit* 87 lines and all FlagA 101 and FlagB 103 lines adequate time to be precharged to $V_{DD}$. Prior to ChipEnable* 31 becoming active, the assertion 187 of Read 185 causes the signal PrechCamBit* 189 to be asserted 191 which, in turn, causes both CamBit 85 and CamBit* 87 to be pulled up 193, 195 to $V_{DD}$. The signal Precharge* 83 is always active while ChipEnable* 31 is not active. Precharge* 83 is the internally generated signal which causes all CamWord 69 lines, FlagWordA 93 lines, FlagWordB 95 lines, and EnableCompare 81 lines to be pulled down to $V_{SS}$ and all FlagA 101 lines, FlagB 103 lines, and QueryTrue 97 lines to be precharged up to $V_{DD}$. Precharge* 83 also causes all instances of EnableNext* 111 to be precharged to Vdd. Each CAM memory cell 37, 39 contains an instance of EnableNext* 111. The Read operation, however, does not make use of EnableCompare 81, QueryTrue 97, ComparisonOp 89, or EnableNext* 111.

When the externally generated ChipEnable* 31 becomes active 197, Precharge* 83, PrechCamBit* 189, and FlagAClear 117, become inactive 199, 201, 202. Precharge* 83 becoming inactive 199 allows all FlagA 101 and FlagB 103 lines to float undriven while PrechCamBit* 189 becoming inactive 201 allows all CamBit 85 and CamBit* 87 lines to float undriven. ChipEnable* 31 becoming active 197 causes the Flag Word 45 selected by FlagAddressA 47 to be read out of Flag Memory 7 by activating 203 its FlagARead line 113. FlagAddressA 47 also selects one bit in the Priority Register 27 to be read. If this bit from the Priority Register 27 is a '1', the External Data Bus 43 drivers on the chip become active 205. If this bit is a '0', the External Data Bus 43 remain inactive and allow another chip 1 in the system to drive the External Data Bus 43 which connects all the chips in the system. The activation 203 of one of the FlagARead 113 lines 203 causes that entire Flag Word 45 to be read 207 out of the Flag Memory 1. This entire Flag Word 45 is input into the Priority Resolver 25. The Priority Resolver 25 then selects the highest priority Flag Bit 46 which has a value equal to '1'. The Priority Resolver 25 has one output, HighestPriority 105, corresponding to each word 28 in the CAM Array 3. HighestPriority 105 is a '1' in the one word 28 corresponding to the selected highest priority flag bit and an output of '0' for all the other words. The word 28 which has its HighestPriority 105 set to '1' enables 209 its corresponding CamWord 69 line. The enabled CamWord 69 line causes all bits in that CAM Array Word 33 to be output 211, 213 onto their two bit lines, CamBit 85 and CamBit* 87. Each pair of bit lines 85, 87 is a differential signal pair, so one half of each pair is pulled down while the other remains high. Each pair is input into a sense amplifier which determines which half of the differential pair is being pulled down and thus determines whether the corresponding bit in the selected CAM Array Word 33 is a '1' or a '0'. This value as determined by the sense amp is then output 215 from the chip 1 on the External Data Bus 43. The selected highest priority flag, which, at the start of the Read Cycle, has a value of '1', is cleared at the end of the Read Cycle to a value of '1' by the assertion 216 of FlagAClear 117. This allows successive reads selecting the same Flag Word 45 to read different words out of the CAM Array 3. Also, as an optional feature of the implementation, the selected highest priority flag is used to set another Flag Bit 46 to '1'. This requires the use of a second flag word address, FlagAddressB 49 which causes the activation of FlagBSet 121 at the end of the Read Cycle. Thus, one Flag Bit 46 in this second Flag Word 45 is set by the Read operation.

The selected Flag Word 45 is also input into the Flag Or Circuit 19 to form the signal ActiveWord* 61 which is output 217 from the chip 1. This is done by allowing FlagResult 55 to have the value of FlagA 101 anded with Flag0 99. An External Priority Resolver 77 receives ActiveWord* 61 from each chip 1 in the entire system. Since each chip 1 in the system is assigned a priority, this External Priority Resolver 77 determines the highest priority chip 1 which has its ActiveWord* 61 signal asserted. The selected highest priority chip 1 receives 219 a '1' on ChipPriorityIn 75 while all other chips will recieve 219 a '0' on their ChipPriorityIn 75. The value at ChipPriorityIn 75 is clockeded into a bit in the Priority Register 27 on the next falling edge of ChipEnable* 31.

At the end of the Read Cycle, ChipEnable* 31 becomes inactive 221, which in turn causes Precharge* 83 to become active 225, which then, in turn, precharges 227, 229, 231 all FlagA 101 and FlagB 103 lines and CamBit 85 and CamBit* 87 lines and also drives all FlagARead 93 lines, FlagBRead 95 lines, and CamWord 69 lines inactive 233, 235. Also at the end of the cycle, PrechCamBit* 189 is activated 223, but this must occur after all CamWord 69 lines become inactive 235. The output drivers of the chip 1 also become inactive 237 when ChipEnable* 31 becomes inactive 221.

Write Cycle Timing

Figure 14:
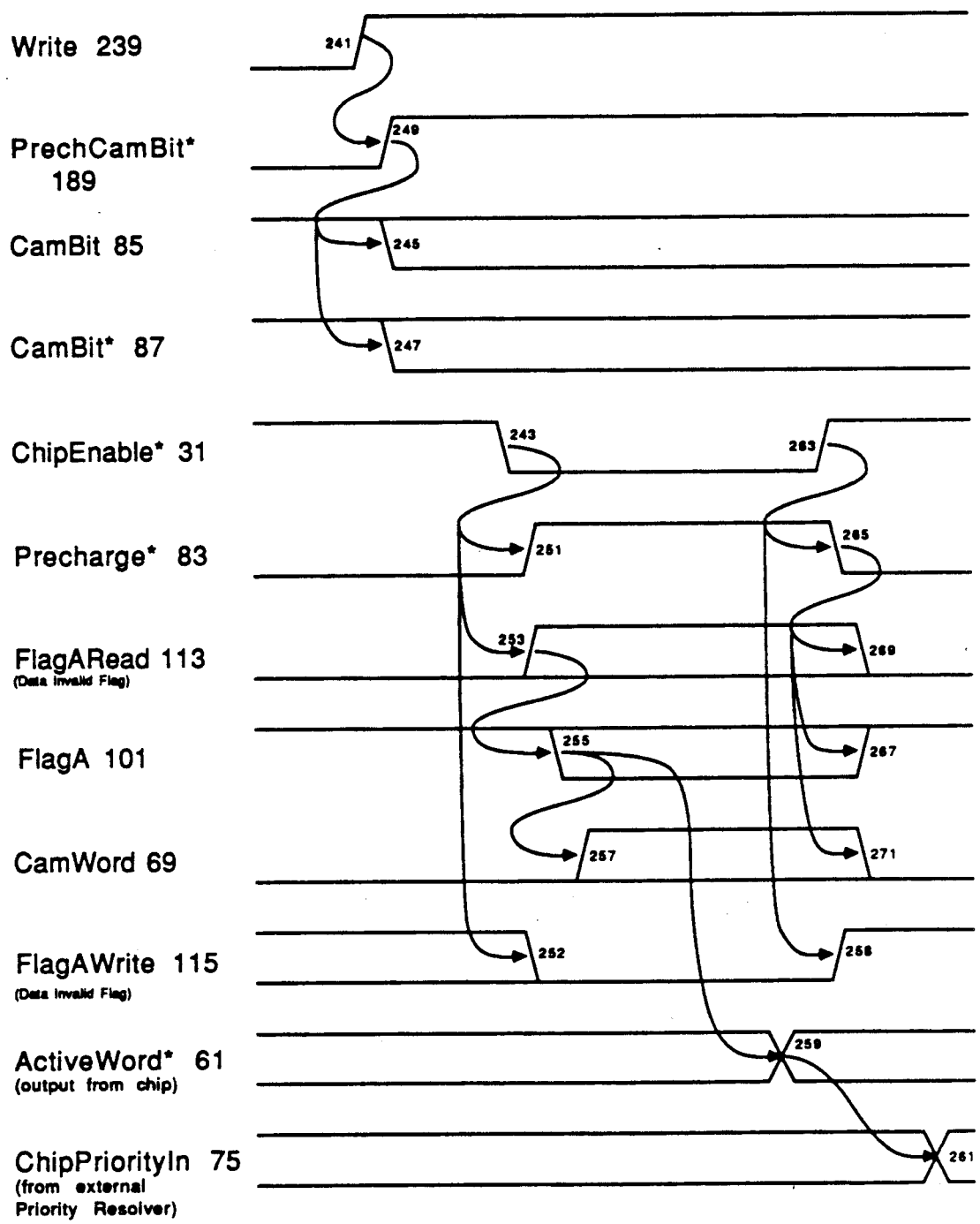
FIG. 14: Write Cycle Timing This is the signal timing which occurs when the CAM chip performs a write operation.

A Write Cycle is an operation which writes one word of data into the CAM chip 1 in one clock cycle. This Write operation selects the "Data Invalid" Flag Word 45, then uses the Priority Resolver 25 to find the highest priority Flag Bit 46 in this Flag Word 45 which is on, then writes one word of data into the CAM Array 3 at the location which corresponds to this highest priority Flag Bit 46. The timing diagram for a Write Cycle is shown in FIG. 14.

The signal Write 239 is a control signal decoded from CamOp 29, a set of external control signals which encode the operation the CAM chip 1 is to perform. Write 239 must be asserted 241 an appropriate setup time prior to ChipEnable* 31 becoming active 243 to allow all FlagA 101 lines and FlagB 103 lines adequate time to be precharged to $V_{DD}$ and all CamBit 85 and CamBit* 87 lines and ComparisonOp 89 lines to be driven 245, 247 to the value required by the data input from the External Data Bus 43. Prior to ChipEnable* 31 becoming active 243, the assertion 241 of Write 239 causes the chip's 1 data output drivers to remain inactive and the signal PrechCamBit* 83 to be deactivated 249 which, in turn, allows both CamBit 85 and CamBit* 87 to be driven 245, 247 according to the data input to the chip 1. The signal Precharge* 83 is always active while ChipEnable* 31 is not active. Precharge* 83 is the internally generated signal which causes all CamWord 69 lines, FlagA 101 lines, FlagB lines 103, and EnableCompare 81 lines to be pulled down to $V_{SS}$ and all FlagBit 46 lines and QueryTrue 97 lines to be precharged up to $V_{DD}$. Precharge* 83 also causes all instances of EnableNext* 111 to be precharged to $V_{DD}$. Each CAM Bit Cell 37, 39 contains an instance of EnableNext* 111. The Write operation, however, does not make use of EnableCompare 81, QueryTrue 97, or EnableNext* 111. If CAM Bit Cell A 37 is used in the implementation of the design, ComparisonOp 89 is not used during the Read Cycle. If CAM Bit Cell B 39 is used, ComparisonOp 89 is used to enable or disable writing to each bit position in the CAM Array Word 33. The value of the Mask Register 11 does not affect the operation of the Write Cycle.

When the externally generated ChipEnable* 31 becomes active 241, Precharge* 83 and FlagAWrite 115 become inactive 251, 252. Precharge* 83 becoming inactive 251 allows all FlagA 101 and FlagB 103 lines to float undriven. ChipEnable* 31 becoming active 243 also causes the FlagARead 113 line corresponding to the "Data Invalid" Flag Word to become active 253. The activation 253 of this FlagARead 115 line causes that entire Flag Word 45 to be read 255 out of the Flag Memory 7 onto the FlagA 101 lines. This entire Flag Word 45 is input into the Priority Resolver 25. The Priority Resolver 25 then selects the highest priority Flag Bit 46 which has a value equal to '1'. The Priority Resolver 25 has one output corresponding to each CAM Array Word 33. The output of the Priority Resolver 25 is a '1' for the one output corresponding to the selected highest priority Flag Bit 46 and a value of '0' for all the other outputs. The output which is a '1' enables 257 its corresponding CamWord 69 line. The enabled 257 CamWord 69 line causes all bits in that CAM Array Word 33 to be written into from their two bit lines, CamBit 85 and CamBit* 87. Each pair of these bit lines 85, 87 is a differential signal pair, so one half of each pair is driven high while the other is driven low. The selected highest priority Flag Bit 46, which, at the start of the Write Cycle, has a value of '1', is written with the value '0' indicating that this CAM Word 28 now contains a valid data word. This requires FlagResult 55 to have the value '0' and FlagAWrite 115 to be activated 258 at the end of the Write Cycle. This allows successive write operations to fill in places where no valid data exists and also keeps valid data from being overwritten. Also, as an optional feature of the implementation, the selected highest priority Flag Bit 46 is used to set another Flag Bit 46 to '1'. This requires the use of an external flag word address, such as FlagAddressB 49. Thus, one Flag Bit 46 in this second Flag Word 45 is set by the Write operation.

The selected Flag Word 45 is also input into the Flag Or 19 Circuit to form the signal ActiveWord* 61 which is output 259 from the chip 1. This is done by allowing FlagResult 55 to have the value of Flag0 99. The External Priority Resolver 77 receives ActiveWord* 61 from each chip 1 in the entire system. Since each chip 1 in the system is assigned a priority, the External Priority Resolver 77 determines the highest priority chip 1 which has its ActiveWord* 61 signal asserted. The selected highest priority chip 1 receives 261 a '1' on its ChipPriorityIn 75 while all other chips 1 will receive 261 a '0' on their ChipPriorityIn 75. The value at ChipPriorityIn 75 is clocked into a bit in the Priority Register 27 on the next falling edge of ChipEnable* 31.

At the end of the Write Cycle, ChipEnable* 31 becomes inactive 263, which in turn causes Precharge* 83 to become active 265, which then in turn precharges 267 all FlagA 101 and FlagB 103 lines and also drives all FlagARead 115 lines and CamWord 69 lines inactive 269, 271. The output drivers of the chip remain inactive when ChipEnable* 31 becomes inactive 263.

Query Cycle Timing

Figure 15:
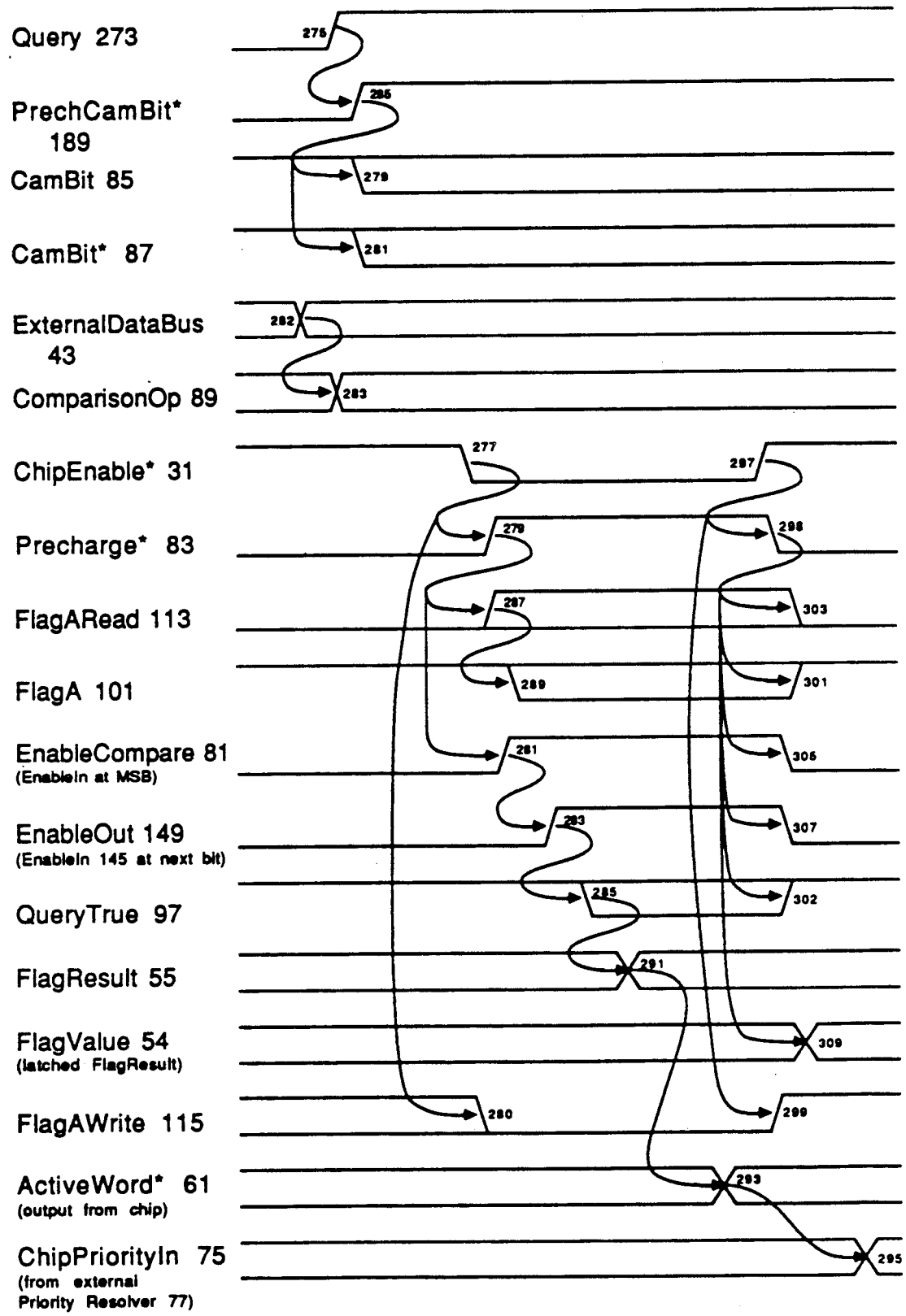
FIG. 15: Query Cycle Timing This is the signal timing which occurs when the CAM chip performs a query operation.

A Query Cycle is a one clock cycle operation which interrogates all words in the CAM chip 1. This Query operation compares input data from the External Data Bus 43 to the contents of each CAM Array Word 33 in the CAM chip 1. For each CAM Array Word 33, the comparison result, QueryTrue 97, together with several Flag Bits 46 are used to compute a new flag value, FlagResult 55, which is stored into the Flag Memory 7. The computation of the new flag value takes place in the Flag Logic 15 portion of the chip 1. For two of the Flag Words 45 used in this computation, external flag address, FlagAddressA 47 and FlagAddressB 49, are supplied to determine which Flag Bits 46 will be used. The resulting flag value, FlagResult 55, is written to the Flag Word 45 specified by FlagAddressA 47. FlagResult 55 from all the words are "or"ed together to generate an output signal, ActiveWord* 61, which indicates if any of the queries had a "true" result. The Priority Resolver 25 is not used during the Query Cycle. The timing diagram for a Query Cycle is shown in FIG. 15.

The signal Query 273 is a control signal decoded from CamOp 29, a set of external control signals which encode the operation the CAM chip 1 is to perform. Query 273 must be asserted 275 an appropriate setup time prior to ChipEnable* 31 becoming active 277 to allow all FlagA 101 lines and FlagB 103 lines adequate time to be precharged to $V_{DD}$ and all CamBit 85 and CamBit* 87 lines and ComparisonOp 89 lines to be driven 279, 281, 283 to the value required by the data input 282 from the External Data Bus 43. Prior to ChipEnable* 31 becoming active 277, the assertion 275 of Query 273 causes the chip's 1 data output drivers to remain inactive and the signal PrechCamBit* 83 to be deactivated 285 which, in turn, allows both CamBit 85 and CamBit* 87 to be driven 279, 281 according to the data input to the chip 1. ComparisonOp 89 is an internally generated signal which is derived from the input data and the QueryOp 41 input. The values on the ComparisonOp 89 lines, CamBit 85 and CamBit* 87 lines, and NotEqual 143 signals should be stable before ChipEnable* 31 becomes active 277. The signal Precharge* 83 is always active while ChipEnable* 31 is not active. Precharge* 83 is the internally generated signal which causes all CamWord 28 lines, FlagARead 113 and FlagBRead 115 lines, and EnableCompare 81 lines to be pulled down to $V_{SS}$ and all FlagA 101 and FlagB 103 lines and QueryTrue 97 lines to be precharged up to $V_{DD}$. Precharge* 83 also causes all instances of EnableNext* 111 to be precharged to $V_{DD}$. Each CAM memory cell 37, 39 contains an instance of EnableNext* 111.

When the externally generated ChipEnable* 31 becomes active 277, Precharge* 83 becomes inactive 279. Precharge* 83 becoming inactive 279 allows all FlagA 101 and FlagB 103 lines, QueryTrue 97 lines, and EnableNext* 111 signals to float undriven and also causes EnableCompare 81 to become active 281. EnableCompare 81 is tied to the EnableIn 145 signal of the most significant bit in each Subfield 35 in each CAM Array Word 33. Thus, EnableCompare 81 initiates a comparison in each Subfield 35 of every CAM Array Word 33 on the entire chip 1. Within each CAM Bit Cell 37, 39, NotEqual 143 indicates if the bit value on the CamBit 85 line is not equal to the bit stored in the cell 37, 39. At each bit in a Subfield 35, when EnableIn 145 goes high 281, EnableOut 149 will go high 283 and enable the next cell 37, 39 if and only if NotEqual 143 is low. If NotEqual 143 is high when EnableIn 145 goes high 281, EnableOut 149 will remain low, but QueryTrue 97 will be pulled low 285 if ComparisonOp 89 is low. Thus, this ripple of EnableIn 145 to EnableOut 149 proceeds from bit to bit through the Subfield 35 until either a bit is encountered where NotEqual 143 is high or all bits in the Subfield 35 have been rippled through. Each CAM Array Word 33 has one Query True 97 line, so every bit comparison performed in the word has the opportunity to change the query result for that word from true to false. A true result will occur only if all comparisons are true. If EnableOut 149 of the least significant CAM Bit Cell 37, 39 within a Subfield 35 becomes active, this indicates that the input data is equal to the data stored in the Subfield 35. If this occurs, and Equality* 91 is inactive, QueryTrue 97 will be pulled down. The signal, Equality* 91, occurs once in each Subfield 35 and is set according to QueryOp 41.

ChipEnable* 31 becoming active 277 also causes FlagARead 113 and FlagBRead 119 lines to become active 287. These activated lines 113, 119 are selected using the flag address lines, FlagAddressA 47 and FlagAddressB 49. For example, the activation 287 of a FlagARead 113 line causes that entire Flag Word 45 to be read 289 out of the Flag Memory 7 and placed on the FlagA 101 lines. Each Flag Word 45 read in this manner is input to the Flag Logic 15. The Flag Logic 15 computes 291 the value of FlagResult 55 based upon the values of QueryTrue 97, FlagLogicOpInternal 51, and the Flags Bits 46 read out of Flag Memory 7. FlagResult 55 from all words on the chip 1 are "or'ed" together in the Flag Or 19 Circuit to form the signal ActiveWord* 61 which is output 293 from the chip 1. The External Priority Resolver 77 receives ActiveWord* 61 from each chip 1 in the entire system. Since each chip 1 in the system is assigned a priority, this External Priority Resolver 77 determines the highest priority chip 1 which has its ActiveWord* 61 signal asserted. The selected highest priority chip 1 receives 295 a '1' on ChipPriorityIn 75 while all other chips will receive 295 a '0' on their ChipPriorityIn 75. The value at ChipPriorityIn 75 is clocked into a bit in the Priority Register 27 on the next falling edge of ChipEnable* 31.

At the end of the Query Cycle, ChipEnable* 31 becomes inactive 297, causing Precharge* 83 and FlagAWrite 115 to become active 298, 299. Precharge* 83 then in turn precharges 301, 302 all FlagA 101 and FlagB 103 lines, QueryTrue 97 lines, and EnableNext* 111 signals and also drives all FlagARead 117 and FlagBRead 119 lines, CamWord 69 lines, and EnableCompare 81 lines inactive 303, 305. Precharging EnableNext* 111 drives EnableOut 149 low 307. ChipEnable* 31 becoming inactive 297 also enables a latch 309 whose input is QueryResult 55 and whose output is Flag Value 54 so that this value can be written into the Flag Memory 7. The data output drivers of the chip 1 remain inactive when ChipEnable* 31 becomes inactive 297.

Read Mask Register Cycle Timing

Figure 16:
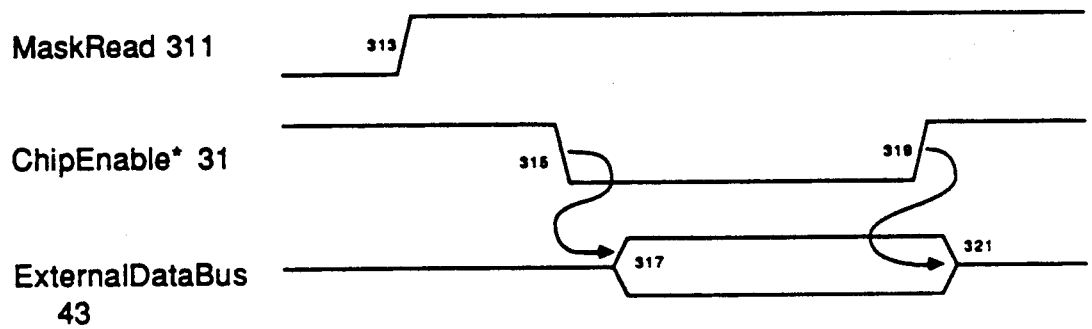
FIG. 16: Read Mask Register Cycle Timing This is the signal timing which occurs when data is read from the CAM Chip's Mask Register.

A Read Mask Register Cycle is an operation which places the data stored in the Mask Register 11 on the External Data Bus 43. In a system with a multiplicity of chips 1, each chip 1 contains the same information in its Mask Register 11. Therefore, it doesn't matter which chip's 1 Mask Register 11 is read. As an arbitrary choice, only the highest priority chip 1 in the system responds to a Read Mask Register Cycle. The timing diagram for a Read Mask Register Cycle is shown in FIG. 16.

The signal MaskRead 311 is a control signal decoded from CamOp 29, a set of external control signals which encode the operaton the CAM chip is to perform. MaskRead 311 must be asserted an appropriate setup time prior to ChipEnable* 31 becoming active 315. When ChipEnable* 31 does become active 315, the External Data Bus 43 becomes active 317 and displays the value stored in the Mask Register 11. At the end of the Read Cycle, ChipEnable* 31 becomes inactive 319, which in turn causes the output drivers of the chip 1 to become inactive 321.

During a Read Mask Register Cycle, only the External Data Bus 43, the Mask Register 11, and the Global Control 2 are active. The rest of the chip 1 is inactive.

Write Mask Register Cycle Timing

Figure 17:
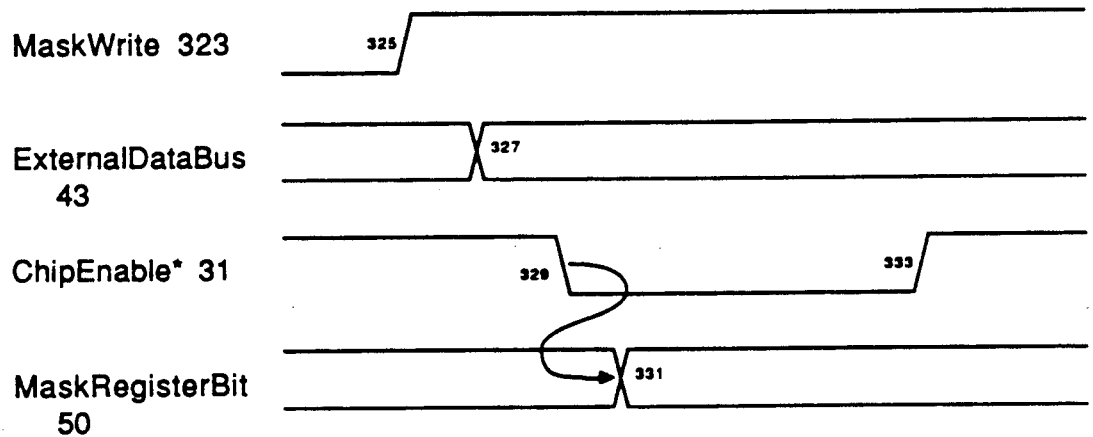
FIG. 17: Write Mask Register Cycle Timing This is the signal timing which occurs when data is written into the CAM Chip's Mask Register.

A Write Mask Register Cycle is an operation which stores data into the Mask Register 11 from the External Data Bus 43. In a system with a multiplicity of chips 1, each chip 1 must contain the same information in its Mask Register 11. Therefore, every chip's 1 Mask Register 11 is written simultaneously. The timing diagram for a Write Mask Register Cycle is shown in FIG. 17.

The signal MaskWrite 323 is a control signal decoded from CamOp 29, a set of external control signals which encode the operaton the CAM chip is to perform. ExternalDataBus 43 must have the new mask value 327 and MaskWrite 323 must be asserted 325 an appropriate setup time prior to ChipEnable* 31 becoming active 329. When ChipEnable* 31 does become active 329, the bit pattern on the External Data Bus 43 is stored 331 bit-for-bit into the Mask Register 11. At the end of the Read Cycle, ChipEnable* 31 becomes inactive 333.

During a Write Mask Register Cycle, only the External Data Bus 43, the Mask Register 11, and the Global Control 2 are active. The rest of the chip 1 is inactive.

Addressed Read Cycle Timing

Figure 18:
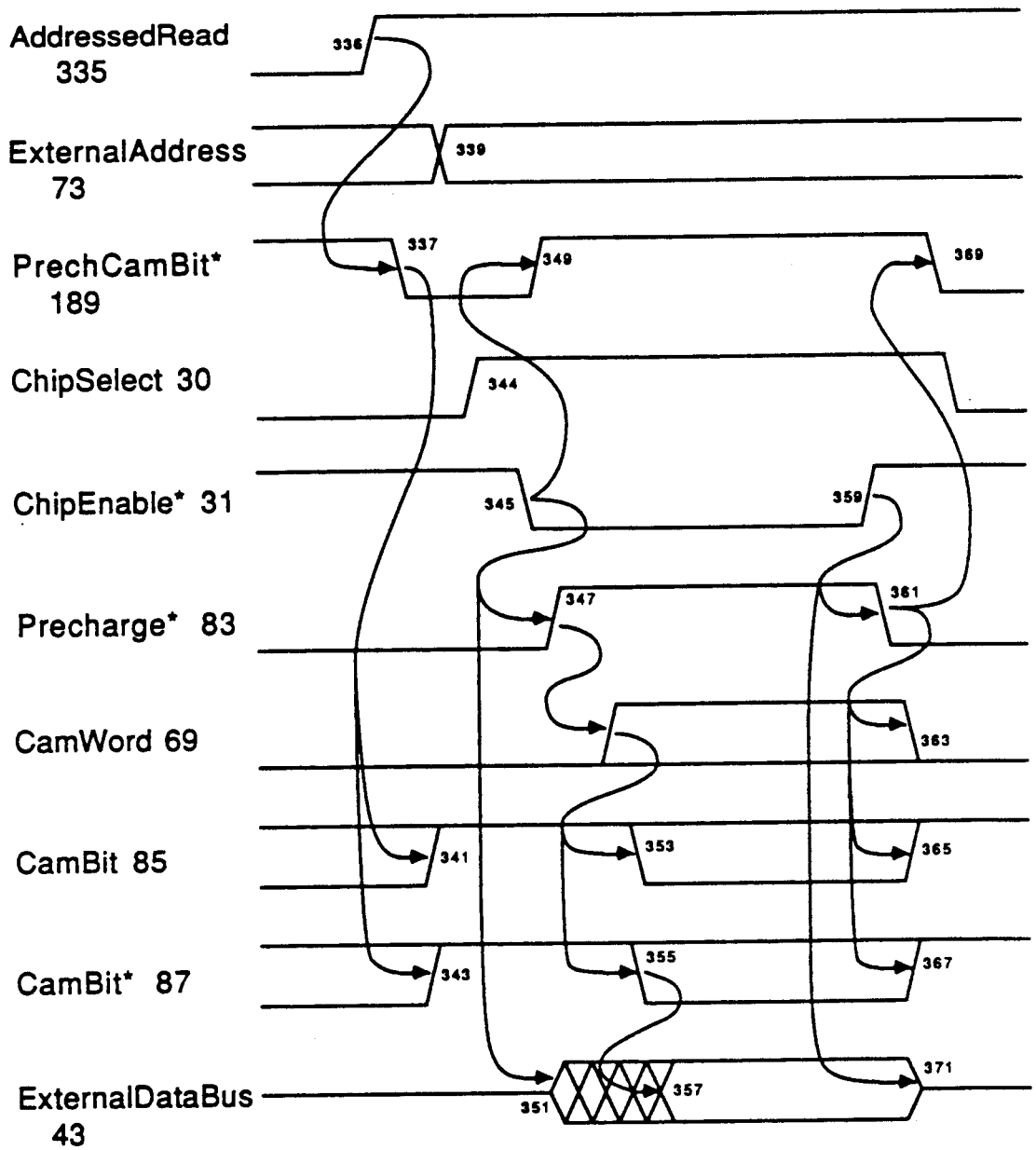
FIG. 18: Addressed Read Cycle Timing This is the signal timing which occurs when the CAM chip performs an addressed read operation.

An Addressed Read Cycle is an operation which reads one word of data from the CAM chip 1 in one clock cycle. This Read operation selects one CAM Array Word 33 through the use of the External Address 73. When a multiplicity of chips 1 are used together in a system, only one CAM chip 1 is allowed to perform the Read Operation. Of all the chips 1 in the system, the one designated to perform the read operation is chosen by the signal ChipSelect 30. The timing diagram for an Addressed Read Cycle is shown in FIG. 18.

The signal AddressedRead 335 is a control signal decoded from CamOp 29, a set of external control signals which encode the operaton the CAM chip is to perform. AddressedRead 335 must be asserted an appropriate setup time prior to ChipEnable* 31 becoming active 345 to allow all CamBit 85 and CamBit* 87 lines adequate time to be precharged to $V_{DD}$. ChipSelect 30 must also be asserted 344 before ChipEnable* 31 becomes active 345 in order to indicate this particular chip 1 is to perform the read operation. If ChipSelect 30 is not active, no operation is performed. Prior to ChipEnable* 31 becoming active 345, the assertion 336 of AddressedRead 335 causes the signal PrechCamBit* 189 to be asserted 337 which, in turn, causes both CamBit 85 and CamBit* 87 to be pulled up 341, 343 to $V_{DD}$. Also prior to ChipEnable* 31 becoming active 345, an ExternalAddress 73 must be specified 339. ExternalAddress 73 specifies which Cam Array Word 33 is to be read, much in the same way conventional random access memories are addressed.

The Addressed Read operation does not make use of an Flag Bits 46, EnableCompare 81, QueryTrue 97, or EnableNext* 111. If CAM Bit Cell A 37 is used in the implementation of the design, ComparisonOp 89 is not used during the Addressed Read Cycle. If CAM Bit Cell B 39 is used, ComparisonOp 89 is set to '1' to allow reading each bit position in the CAM Array Word 33. The value of the Mask Register 11 does not affect the operation of the Addressed Read Cycle.

When the externally generated ChipEnable* 31 becomes active 345, Precharge* 83 and PrechCamBit* 189 become inactive 347, 349. Precharge* 83 becoming inactive 347 allows all FlagA 101 and FlagB 103 lines to float undriven while PrechCamBit* 189 becoming inactive 349 allows all CamBit 85 and CamBit* 87 lines to float undriven. ChipEnable* 31 becoming active 345 causes the drivers for the External Data Bus 43 to become active 351. Once PrechCamBit* 189 and Precharge* 83 have both become inactive 345, 349, the Cam Word 69 corresponding to the selected Cam Array Word 33 becomes active 351, allowing data to be read from the CAM Bit Cells 37, 39 and placed 353, 355 on CamBit 85 and CamBit* 87. Each pair of bit lines 85, 87 is a differential signal pair, so one half of each pair is pulled down while the other remains high. Each pair is input into a sense amplifier which determines which half of the differential pair is being pulled down and thus determines whether the corresponding bit in the selected CAM Array Word 33 is a '1' or a '0'. This value as determined by the sense amp is then output 357 from the chip 1 on the External Data Bus 43.

At the end of the Addressed Read Cycle, ChipEnable* 31 becomes inactive 359, which in turn causes Precharge* 83 to become active 361, which then, in turn, precharges 365, 367 all FlagA 101 and FlagB 103 lines and CamBit 85 and CamBit* 87 lines and also drives all FlagARead 93 lines, FlagBRead 95 lines, and CamWord 69 lines inactive 363. Also at the end of the cycle, PrechCamBit* 189 is activated 369, but this must occur after all CamWord 69 lines become inactive 363. The output drivers of the chip 1 also become inactive 371 when ChipEnable* 31 becomes inactive 359.

Addressed Write Cycle Timing

Figure 19:
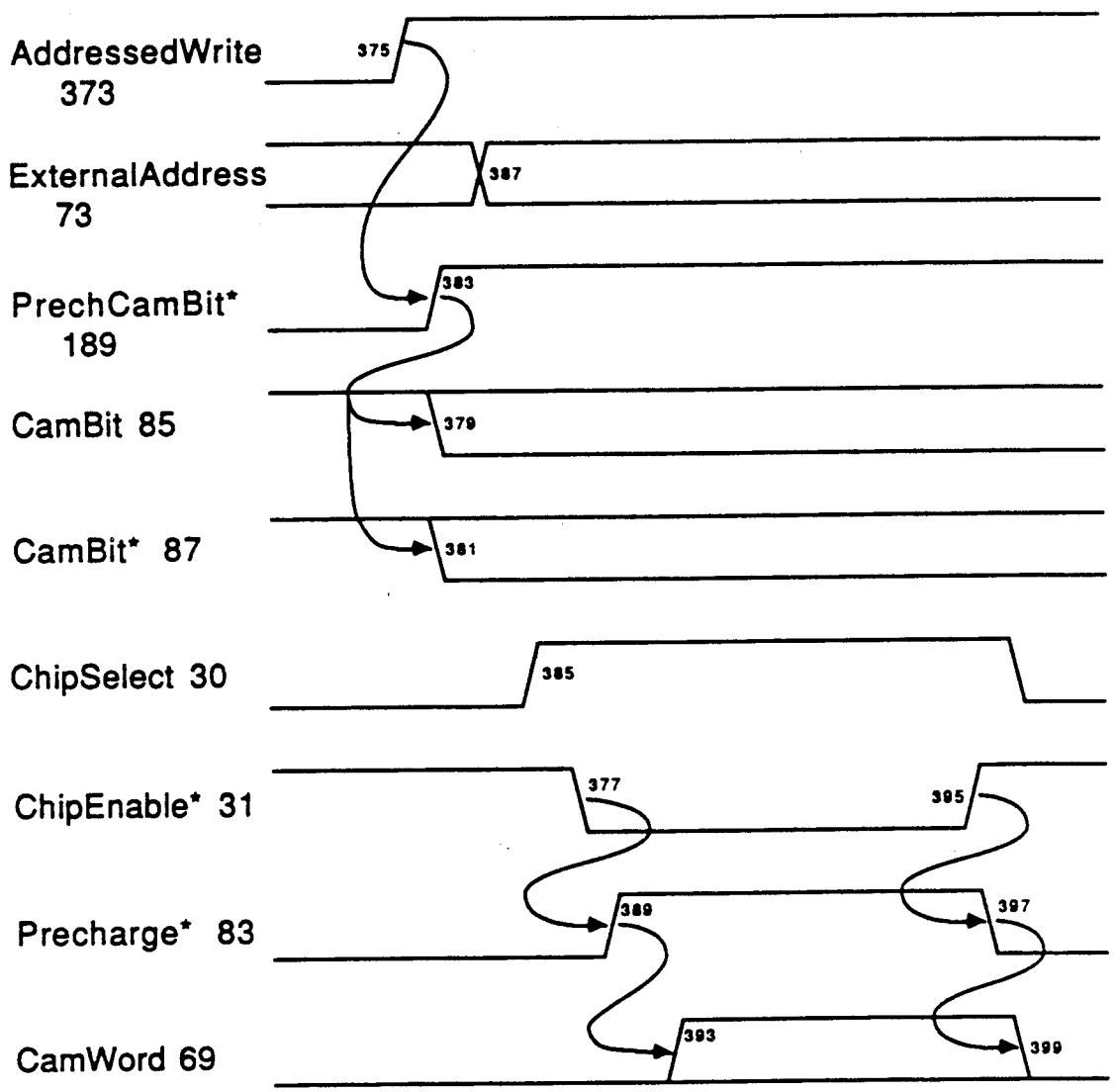
FIG. 19: Addressed Write Cycle Timing This is the signal timing which occurs when the CAM chip performs an addressed write operation.

An Addressed Write Cycle is an operation which writes one word of data into the CAM chip 1 in one clock cycle. This Addressed Write operation selects one CAM Array Word 33 through the use of the External Address 73. When a multiplicity of chips 1 are used together in a system, only one CAM chip 1 is allowed to perform the operation. Of all the chips 1 in the system, the one designated to perform the read operation is chosen by the signal ChipSelect 30. The timing diagram for an Addressed Read Cycle is shown in FIG. 19.

The signal AddressedWrite 373 is a control signal decoded from CamOp 29, a set of external control signals which encode the operation the CAM chip 1 is to perform. AddressedWrite 377 must be asserted 375 an appropriate setup time prior to ChipEnable* 31 becoming active 374 to allow all CamBit 85 and CamBit* 87 lines to be driven 379, 381 to the value required by the data input from the External Data Bus 43. Prior to ChipEnable* 31 becoming active 377, the assertion 375 of AddressedWrite 373 causes the chip's 1 data output drivers to remain inactive 383 and the signal PrechCamBit* 83 to be deactivated 383 which, in turn, allows both CamBit 85 and CamBit* 87 to be driven 379, 381 according to the data input to the chip 1. ChipSelect 30 must also be asserted 385 before ChipEnable* 31 becomes active 377 in order to indicate this particular chip 1 is to perform the write operation. If ChipSelect 30 is not active, no operation is performed. Also prior to ChipEnable* 31 becoming active 377, an ExternalAddress 73 must be specified 387. ExternalAddress 73 specifies which Cam Array Word 33 is to be written, much in the same way conventional random access memories are addressed.

The Addressed Write operation does not make use of EnableCompare 81, QueryTrue 97, or EnableNext* 111. If CAM Bit Cell A 37 is used in the implementation of the design, ComparisonOp 89 is not used during the Addressed Write Cycle. If CAM Bit Cell B 39 is used, ComparisonOp 89 is set to '1' to allow writing to each bit position in the CAM Array Word 33. Flag bits are unaffected, except in the one CAM Array Word 33 which is written. In this CAM Array Word 33, all flags are set to '0'. The value of the Mask Register 11 does not affect the operation of the Addressed Write Cycle.

When the externally generated ChipEnable* 31 becomes active 377, Precharge* 83 becomes inactive 389. Precharge* 83 becoming inactive 389 allows the CamWord 69 corresponding to the selected Cam Array Word 33 to become active 393, allowing data to be written from CamBit 85 and CamBit* 87 into the CAM Bit Cells 37, 39.

At the end of the Write Cycle, ChipEnable* 31 becomes inactive 395, which in turn causes Precharge* 83 to become active 397, which then in turn precharges all FlagA 101 and FlagB 103 lines and also drives all FlagARead 115 lines and CamWord 69 lines inactive 399. The output drivers of the chip remain inactive when ChipEnable* 31 becomes inactive 395.

As an optional feature of the design, it might be desirable to have all Flag Bits 46 included in the written CAM Word 28 to be set to '0'. This would require several circuit changes. It could be accomplished by driving FlagA 101 to a '0' and modifying the Flag Memory Bit 46 to allow FlagAWrite 115 to affect only one CAM Word 28. This could be done, for example, by adding a FlagWriteEnable signal which would be asserted in only one CAM Word 28 during a Addressed Write Cycle. If this were available, FlagAWrite 115 in every Flag Word 45 could be asserted without overwriting flag values in other CAM Words 28.

Masked Write Cycle Timing

Figure 20:
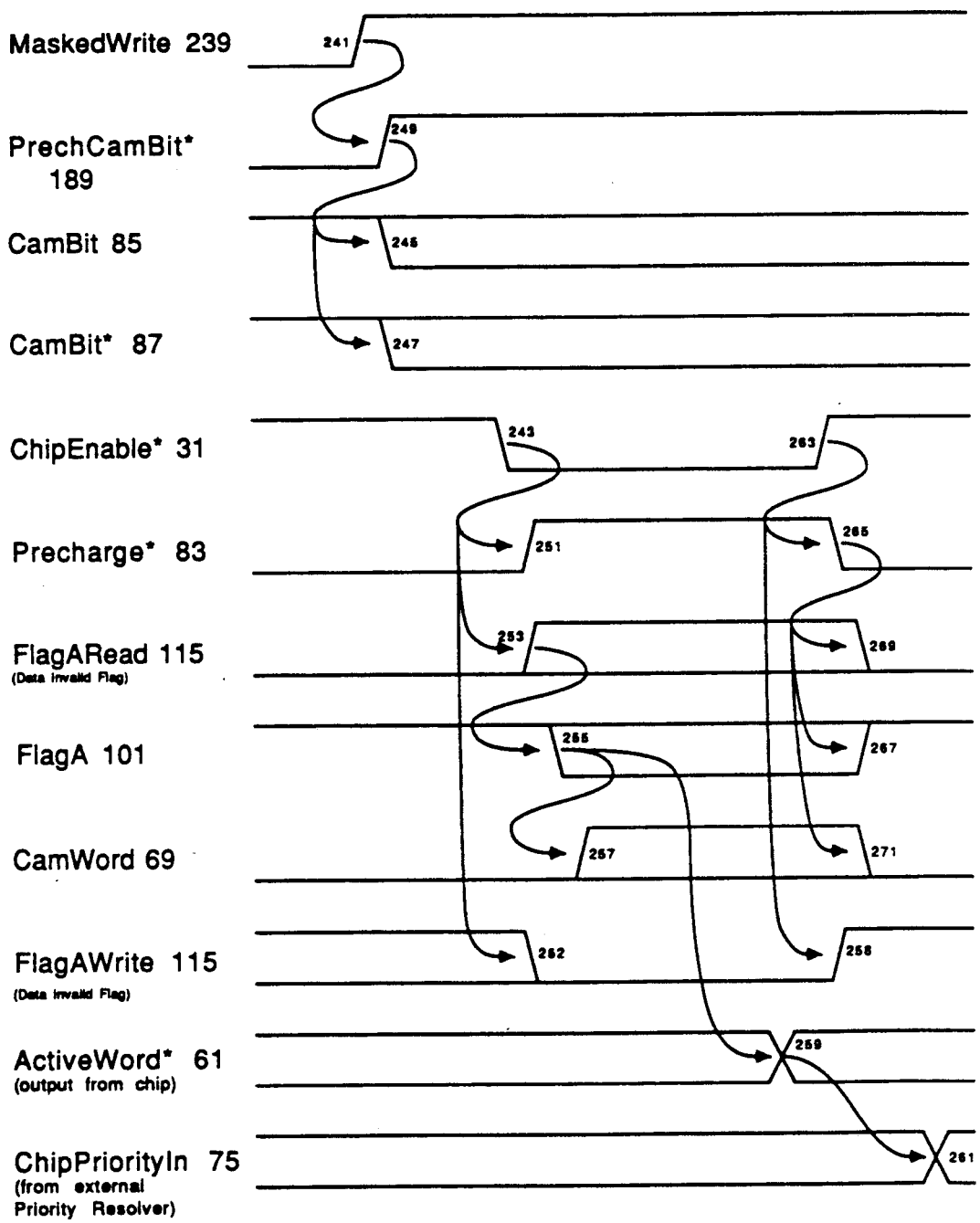
FIG. 20: Masked Write Cycle Timing This is the signal timing which occurs when the CAM chip performs a masked write operation.

A Masked Write Cycle is an operation which writes one word of data into the CAM chip 1 in one clock cycle. This operation is identical to the standard Write Cycle except that some CAM Array Word 33 bit positions can be left unchanged by the operation. Bit positions with a '1' in the corresponding bit position in the Mask Register 11 are written, while those with a '0' are left unchanged. This operation is useful for changing only part of the data in the CAM Array Word 33. The Masked Write operation selects the "Data Invalid" Flag Word 45, then uses the Priority Resolver 25 to find the highest priority Flag Bit 46 in this Flag Word 45 which is on, then writes one word of data into the CAM Array 3 at the location which corresponds to this highest priority Flag Bit 46. The timing diagram for a Write Cycle is shown in FIG. 20.

The signal MaskedWrite 401 is a control signal decoded from CamOp 29, a set of external control signals which encode the operation the CAM chip 1 is to perform. MaskedWrite 401 must be asserted 403 an appropriate setup time prior to ChipEnable* 31 becoming active 405 to allow all FlagA 101 lines and FlagB 103 lines adequate time to be precharged to $V_{DD}$ and all CamBit 85 and CamBit* 87 lines and ComparisonOp 89 lines to be driven 406, 407 to the value required by the data input from the External Data Bus 43 and the value stored in the Mask Register 11. If, for a particular CAM Array Word 33 bit position, the corresponding Mask Bit 50 has the value '1', CamBit 85 and CamBit* 87 are driven according to the input data. If the corresponding Mask Bit 50 has the value '0', CamBit 85 and CamBit* 87 are precharged to a '1' and then allowed to float.

Prior to ChipEnable* 31 becoming active 405, the assertion 403 of MaskedWrite 401 causes the chip's 1 data output drivers to remain inactive and the signal PrechCamBit* 83 to be deactivated 409 which, in turn, allows both CamBit 85 and CamBit* 87 to be driven 406, 407 according to the data input to the chip 1 or allowed to float as designated by the Mask Register 11. Precharge* 83 is the internally generated signal which causes all CamWord 69 lines, FlagA 101 lines, FlagB lines 103, and EnableCompare 81 lines to be pulled down to $V_{SS}$ and all FlagBit 46 lines and QueryTrue 97 lines to be precharged up to $V_{DD}$. Precharge* 83 also causes all instances of EnableNext* 111 to be precharged to $V_{DD}$. Each CAM Bit Cell 37, 39 contains an instance of EnableNext* 111. The Masked Write operation, however, does not make use of EnableCompare 81, QueryTrue 97, or EnableNext* 111. If CAM Bit Cell A 37 is used in the implementation of the design, ComparisonOp 89 is not used during the Read Cycle. If CAM Bit Cell B 39 is used, ComparisonOp 89 is used to enable or disable writing to each bit position in the CAM Array Word 33.

When the externally generated ChipEnable* 31 becomes active 405, Precharge* 83 and FlagAWrite 115 become inactive 411, 412. Precharge* 83 becoming inactive 411 allows all FlagA 101 and FlagB 103 lines to float undriven. ChipEnable* 31 becoming active 405 also causes the FlagARead 113 lines corresponding to the "Data Invalid" Flag Word to become active 413. The activation 413 of this FlagARead 115 line causes that entire Flag Word 45 to be read 415 out of the Flag Memory 7 onto the FlagA 101 lines. This entire Flag Word 45 is input into the Priority Resolver 25. The Priority Resolver 25 then selects the highest priority Flag Bit 46 which has a value equal to '1'. The Priority Resolver 25 has one output corresponding to each CAM Array Word 33. The output of the Priority Resolver 25 is a '1' for the one output corresponding to the selected highest priority Flag Bit 46 and a value of '0' for all the other outputs. The output which is a '1' enables 417 its corresponding CamWord 69 line. The enabled 417 CamWord 69 line causes bits in that CAM Array Word 33 to be written into from their two 85 lines, CamBit 85 and CamBit* 87, provided they 85, 87 are driven. The selected highest priority Flag Bit 46, which, at the start of the Masked Write Cycle, has a value of '1', is written with the value '0' indicating that this CAM Word 28 now contains a valid data word. This requires FlagResult 55 to have the value '0' and FlagAWrite 115 to be activated 418 at the end of the Write Cycle. This allows successive write operations to fill in places where no valid data exists and also keeps valid data from being overwritten. Also, as an optional feature of the implementation, the selected highest priority Flag Bit 46 is used to set another Flag Bit 46 to '1'. This requires the use of an external flag word address, such as FlagAddressB 49. Thus, one Flag Bit 46 in this second Flag Word 45 is set by the Write operation.

The selected Flag Word 45 is also input into the Flag Or 19 Circuit to form the signal ActiveWord* 61 which is output 419 from the chip 1. This is done by allowing FlagResult 55 to have the value of Flag0 99. The External Priority Resolver 77 receives ActiveWord* 61 from each chip 1 in the entire system. Since each chip 1 in the system is assigned a priority, the External Priority Resolver 77 determines the highest priority chip 1 which has its ActiveWord* 61 signal asserted. The selected highest priority chip 1 receives 421 a '1' on its ChipPriorityIn 75 while all other chips 1 will receive 421 a '0' on their ChipPriorityIn 75. The value at ChipPriorityIn 75 is clocked into a bit in the Priority Register 27 on the next falling edge of ChipEnable* 31.

At the end of the Write Cycle, ChipEnable* 31 becomes inactive 423, which in turn causes Precharge* 83 to become active 425, which then in turn precharges 427 all FlagA 101 and FlagB 103 lines and also drives all FlagARead 115 lines and CamWord 69 lines inactive 429, 431. The output drivers of the chip remain inactive when ChipEnable* 31 becomes inactive 423.

Masked Query Cycle Timing

Figure 21:
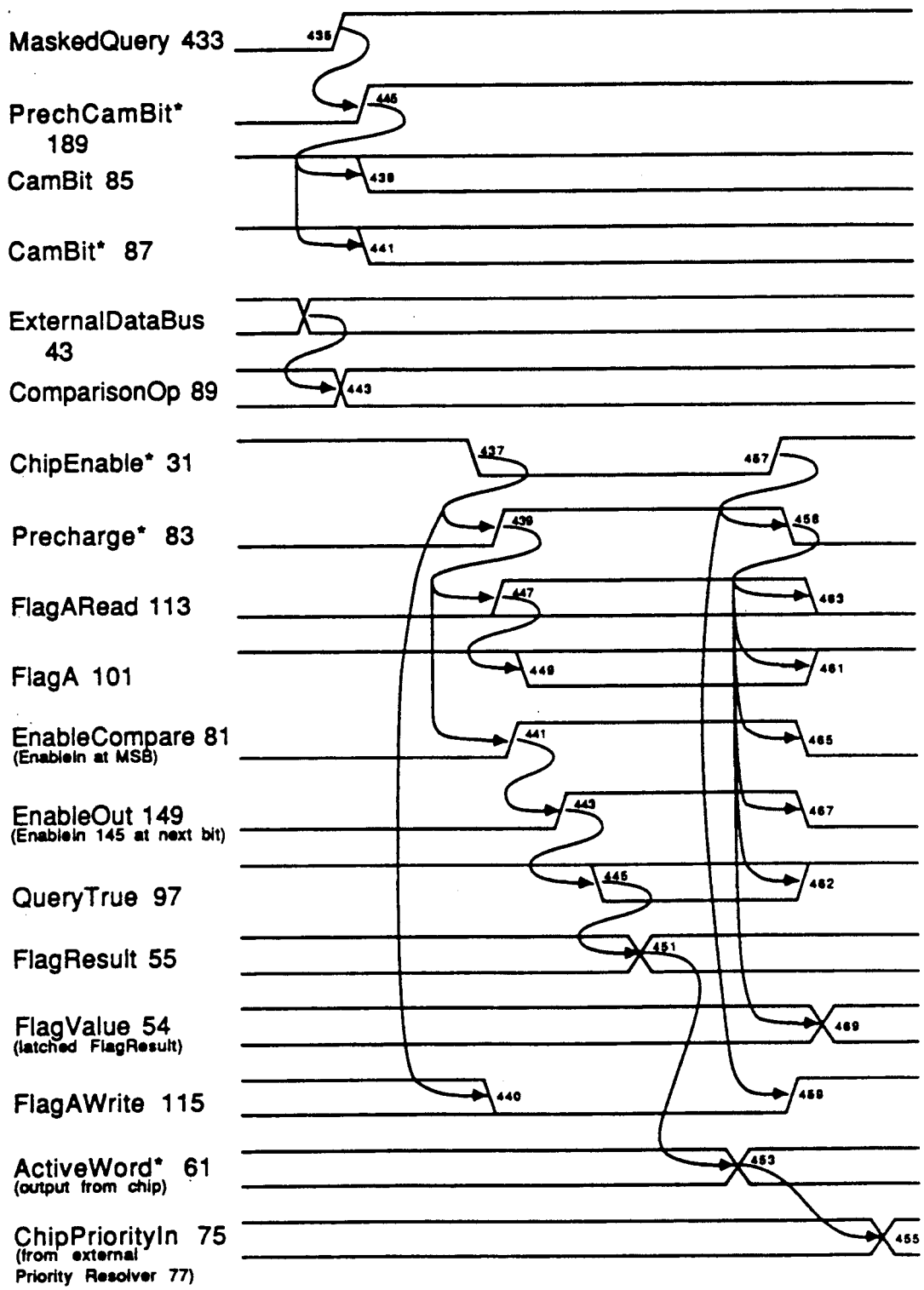
FIG. 21: Masked Query Cycle Timing This is the signal timing which occurs when the CAM chip performs a masked query operation.
Figure 22:
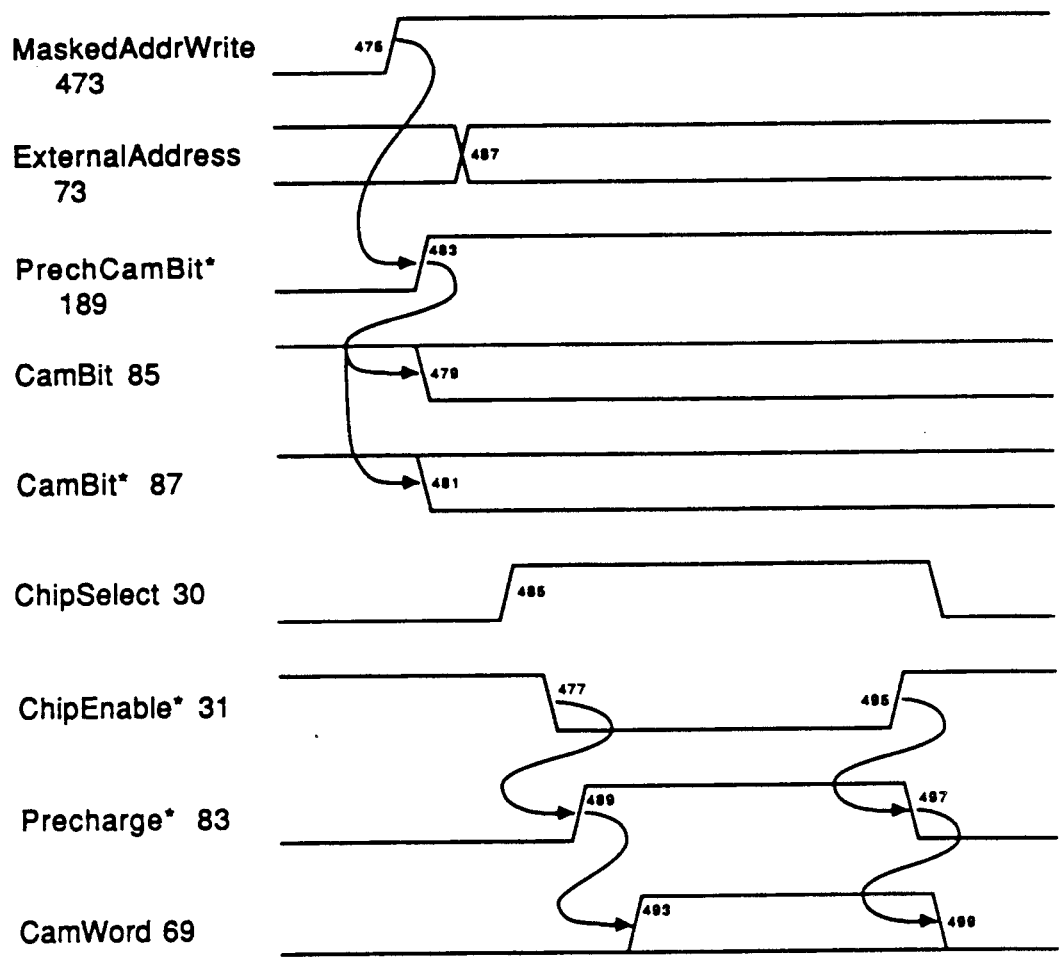
FIG. 22: Masked-Addressed Write Cycle Timing This is the signal timing which occurs when the CAM chip performs a masked-addressed write operation.
Figure 23:
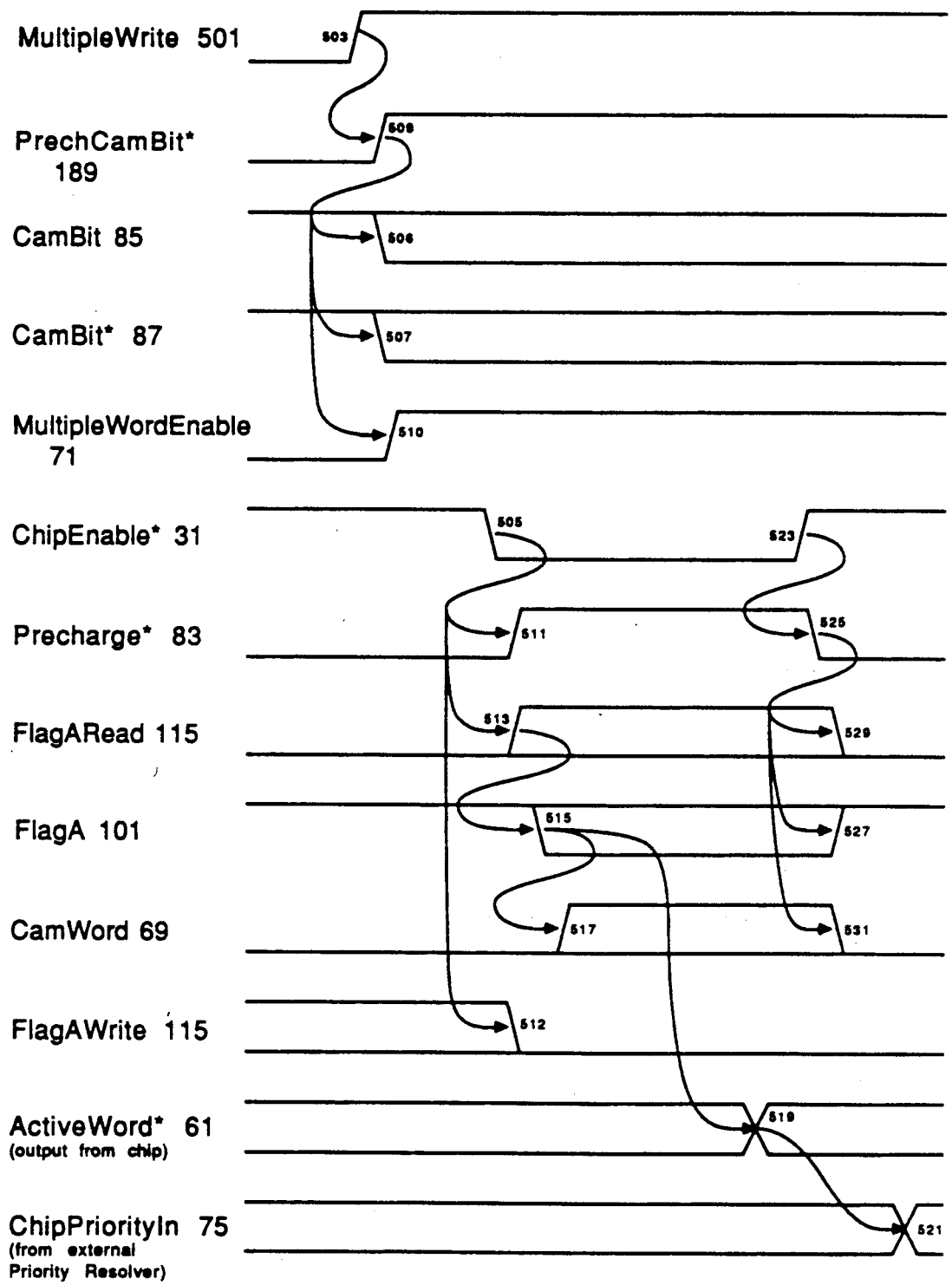
FIG. 23: Multiple Write Cycle Timing This is the signal timing which occurs when the CAM chip performs a multiple write operation.
Figure 24:
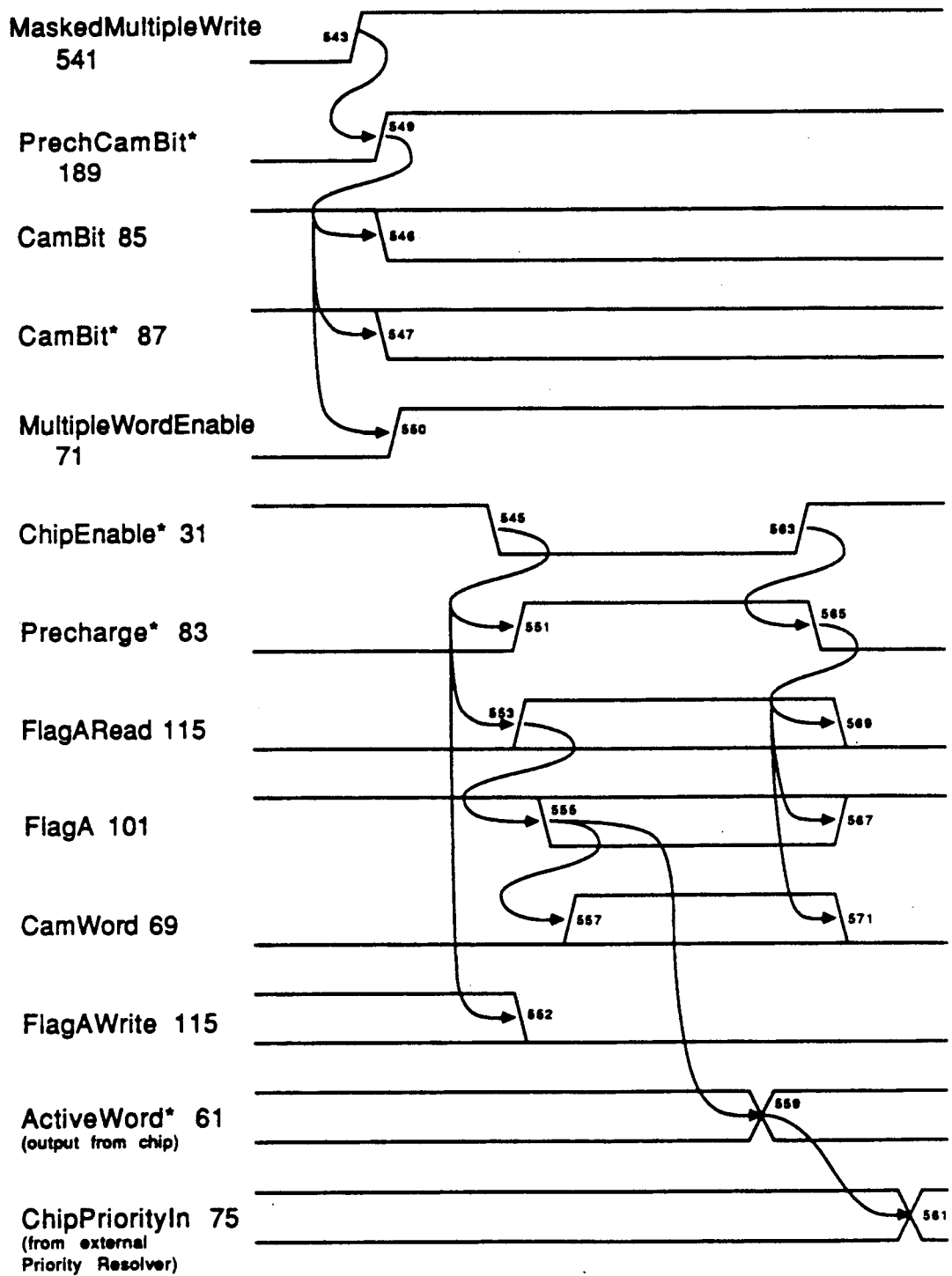
FIG. 24: Masked-Multiple Write Cycle Timing This is the signal timing which occurs when the CAM chip performs a masked-multiple write operation.

A Masked Query Cycle is a one clock operation which interrogates all words in the CAM chip 1. Just as in the Query operation, this Masked Query operation compares input data from the External Data Bus 43 to the contents of each CAM Array Word 33 in the CAM chip 1. The only difference between these two types of operations is the Masked Query Cycle allows some bit positions to have no effect on the query result (i.e. these positions are "masked"). For each CAM Array Word 33, the comparison result, QueryTrue 97, together with several Flag Bits 46 are used to compute a new flag value, FlagResult 55, which is stored into the Flag Memory 7. The computation of the new flag value takes place in the Flag Logic 15 portion of the chip 1. For two of the Flag Words 45 used in this computation, external flag address, FlagAddressA 47 and FlagAddressB 49, are supplied to determine which Flag Bits 46 will be used. The resulting flag value, FlagResult 55, is written to the Flag Word 45 specified by FlagAddressA 47. FlagResult 55 from all the words are "or'ed" together to generate an output signal, ActiveWord* 61, which indicates if any of the queries had a "true" result. The Priority Resolver 25 is not used during the Masked Query Cycle. The timing diagram for a Masked Query Cycle is shown in FIG. 21.

The signal MaskedQuery 433 is a control signal decoded from CamOp 29, a set of external control signals which encode the operation the CAM chip 1 is to perform. MaskedQuery 433 must be asserted 435 an appropriate setup time prior to ChipEnable* 31 becoming active 437 to allow all FlagA 101 lines and FlagB 103 lines adequate time to be precharged to $V_{DD}$ and all CamBit 85 and CamBit* 87 lines and ComparisonOp 89 lines to be driven 439, 441, 443 to the value required by the data input 442 from the External Data Bus 43 and the value in the Mask Register 11. Prior to ChipEnable* 31 becoming active 437, the assertion 435 of MaskedQuery 433 causes the chip's 1 data output drivers to remain inactive and the signal PrechCamBit* 83 to be deactivated 445 which, in turn, allows both CamBit 85 and CamBit* 87 to be driven 439, 441 according to the data input to the chip 1. ComparisonOp 89 is an internally generated signal which is derived from the input data and the QueryOp 41 input. The values on the ComparisonOp 89 lines, CamBit 85 and CamBit* 87 lines, and NotEqual 143 signals should be stable before ChipEnable* 31 becomes active 437. The signal Precharge* 83 is always active while ChipEnable* 31 is not active. Precharge* 83 is the internally generated signal which causes all CamWord 28 lines, FlagARead 113 and FlagBRead 115 lines, and EnableCompare 81 lines to to be pulled down to $V_{SS}$ and all FlagA 101 and FlagB 103 lines and QueryTrue 97 lines to be precharged up to $V_{DD}$. Precharge* 83 also causes all instances of EnableNext* 111 to be precharged to $V_{DD}$. Each CAM memory cell 37, 39 contains an instance of EnableNext* 111.

When the externally generated ChipEnable* 31 becomes active 437, Precharge* 83 becomes inactive 439. Precharge* 83 becoming inactive 439 allows all FlagA 101 and FlagB 103 lines, QueryTrue 97 lines, and EnableNext* 111 signals to float undriven and also causes EnableCompare 81 to become active 441. EnableCompare 81 is tied to the EnableIn 145 signal of the most significant bit in each Subfield 35 in each CAM Array Word 33. Thus, EnableCompare 81 initiates a comparison in each Subfield 35 of every CAM Array Word 33 on the entire chip 1. Within each CAM Bit Cell 37, 39, NotEqual 143 indicates if the bit value on the CamBit 85 line is not equal to the bit stored in the cell 37, 39. At each bit in a Subfield 35, when EnableIn 145 goes high 441, EnableOut 149 will go high 443 and enable the next cell 37, 39 if and only if NotEqual 143 is low. If NotEqual 143 is high when EnableIn 145 goes high 441, EnableOut 149 will remain low, but QueryTrue 97 will be pulled low 445 if ComparisonOp 89 is low. Thus, this ripple of EnableIn 145 to EnableOut 149 proceeds from bit to bit through the Subfield 35 until either a bit is encountered where NotEqual 143 is high or all bits in the Subfield 35 have been rippled through. Each CAM Array Word 33 has one QueryTrue 97 line, so every bit comparison performed in the word has the opportunity to change the query result for that word from true to false. A true result will occur only if all comparisons are true. If EnableOut 149 of the least significant CAM Bit Cell 37, 39 within a Subfield 35 becomes active, this indicates that the input data is equal to the data stored in the Subfield 35. If this occurs, and Equality* 91 is inactive, QueryTrue 97 will be pulled down. The signal, Equality* 91, occurs once in each Subfield 35 and is set according to QueryOp 41. ChipEnable* 31 becoming active 437 also causes FlagARead 113 and FlagBRead 119 lines to become active 447. These activated lines 113,119 are selected using the flag address lines, FlagAddressA 47 and FlagAddressB 49. For example, the activation 447 of a FlagARead 113 line causes that entire Flag Word 45 to be read 449 out of the Flag Memory 7 and place on the FlagA 101 lines. Each Flag Word 45 read in this manner is input to the Flag Logic 15. The Flag Logic 15 computes 451 the value of FlagResult 55 based upon the values of QueryTrue 97, FlagLogicOpInternal 51, and the Flags Bits 46 read out of Flag Memory 7. FlagResult 55 from all words on the chip 1 are "or'ed" together in the Flag Or 19 Circuit to form the signal ActiveWord* 61 which is output 453 from the chip 1. The External Priority Resolver 77 receives ActiveWord* 61 from each chip 1 in the entire system. Since each chip 1 in the system is assigned a priority, this External Priority Resolver 77 determines the highest priority chip 1 which has its ActiveWord* 61 signal asserted. The selected highest priority chip 1 receives 455 a '1' on ChipPriorityIn 75 while all other chips will receive 455 a '0' on their ChipPriorityIn 75. The value at ChipPriorityIn 75 is clocked into a bit in the Priority Register 27 on the next falling edge of ChipEnable* 31.

At the end of the Masked Query Cycle, ChipEnable* 31 becomes inactive 457, causing Precharge* 83 and FlagAWrite 115 to become active 458,459. Precharge* 83 then in turn precharges 461,462 all FlagA 101 and FlagB 103 lines, QueryTrue 97 lines, and EnableNext* 111 signals and also drives all FlagARead 117 and FlagBRead 119 lines, CamWord 69 lines, and EnableCompare 81 lines inactive 463,465. Precharging EnableNext* 111 drives EnableOut 149 low 467. ChipEnable* 31 becoming inactive 457 also enables a latch 469 whose input is QueryResult 55 and whose output is FlagValue 54 so that this value can be written into the Flag Memory 7. The data output drivers of the chip 1 remain inactive when ChipEnable* 31 becomes inactive 457.

Masked-Addressed Write Cycle Timing

A Masked-Addressed Write Cycle is an operation which writes one word of data into the CAM chip 1 in one clock cycle. This operation is identical to the Addressed Write operation except that some CAM Array Word 33 bit positions can be left unchanged by the operation. Bit positions with a '1' in the corresponding bit position in the Mask Register 11 are written, while those with a '0' are left unchanged. This operation is useful for changing only part of the data in the CAM Array Word 33. The Masked-Addressed Write operation selects one CAM Array Word 33 through the use of the External Address 73. When a multiplicity of chips 1 are used together in a system, only one CAM chip 1 is allowed to perform the operation. Of all the chips 1 in the system, the one designated to perform the read operation is chosen by the signal ChipSelect 30. The timing diagram for an Addressed Read Cycle is shown in FIG. 19.

The signal AddressedWrite 473 is a control signal decoded from CamOp 29, a set of external control signals which encode the operation the CAM chip 1 is to perform. AddressedWrite 477 must be asserted 475 an appropriate setup time prior to ChipEnable* 31 becoming active 474 to allow all CamBit 85 and CamBit* 87 lines to be driven 479,481 to the value required by the data input from the External Data Bus 43 and the value stored in the Mask Register 11. If, for a particular CAM Array Word 33 bit position, the corresponding Mask Bit 50 has the value '1', CamBit 85 and CamBit* 87 are driven according to the input data. If the corresponding Mask Bit 50 has the value '0', CamBit 85 and CamBit* 87 are precharged to a '1' and then allowed to float.

Prior to ChipEnable* 31 becoming active 477, the assertion 475 of AddressedWrite 473 causes the chip's 1 data output drivers to remain inactive and the signal PrechCamBit* 83 to be deactivated 483 which, in turn, allows both CamBit 85 and CamBit* 87 to be driven 479,481 according to the data input to the chip 1. ChipSelect 30 must also be asserted 485 before ChipEnable* 31 becomes active 477 in order to indicate this particular chip 1 is to perform the write operation. If ChipSelect 30 is not active, no operation is performed. Also prior to ChipEnable* 31 becoming active 477, an ExternalAddress 73 must be specified 487. ExternalAddress 73 specifies which Cam Array Word 33 is to be written, much in the same way conventional random access memories are addressed.

The Addressed Write operation does not make use of EnableCompare 81, QueryTrue 97, or EnableNext* 111. If CAM Bit Cell A 47 is used in the implementation of the design, ComparisonOp 89 is not used during the Addressed Write Cycle. If CAM Bit Cell B 39 is used, ComparisonOp 89 is set to '1' to allow writing to each bit position in the CAM Array Word 33. Flag bits 46 are unaffected, except in the one CAM Array Word 33 which is written. In this CAM Array Word 33, all flags are set to '0'. The value of the Mask Register 11 does not affect the operation of the Addressed Write Cycle.

When the externally generated ChipEnable* 31 becomes active 477, Precharge* 83 becomes inactive 489. Precharge* 83 becoming inactive 489 allows the CamWord 69 corresponding to the selected Cam Array Word 33 to become active 493, allowing data to be written from CamBit 85 and CamBit* 87 into the CAM Bit Cells 37,39.

At the end of the Write Cycle, ChipEnable* 31 becomes inactive 495, which in turn causes Precharge* 83 to become active 497, which then in turn precharges all FlagA 101 and FlagB 103 lines and also drives all FlagARead 115 lines and CamWord 69 lines inactive 499. The output drivers of the chip remain inactive when ChipEnable* 31 becomes inactive 495.

Multiple Write Cycle Timing

A Multiple Write Cycle is an operation which writes one word of data into one or more CAM Array Words 33 in one clock cycle. This operation is identical to the standard Write Cycle except that more than one CAM Array Word 33 can be written. Also, it requires use of CAM Bit Cell B 39 and Word Driver B 65. The Multiple Write operation selects a Flag Word 45, then writes data into the CAM Array 3 at every CAM Array Word 33 which has a '1' stored in its Flag Bit 46 within the selected Flag Word 45. The Multiple Write Cycle does not use the Priority Resolver 25 or change the value of any Flag Bits 46. The timing diagram for a Multiple Write Cycle is shown in FIG. 20.

The signal MultipleWrite 501 is a control signal decoded from CamOp 29, a set of external control signals which encode the operation the CAM chip 1 is to perform. MultipleWrite 501 must be asserted 503 an appropriate setup time prior to ChipEnable* 31 becoming active 505 to allow all FlagA 101 lines and FlagB 103 lines adequate time to be precharged to $V_{DD}$ and all CamBit 85 and CamBit* 87 lines and ComparisonOp 89 lines to be driven 506,507 to the value required by the data input from the External Data Bus 43.

Prior to ChipEnable* 31 becoming active 505, the assertion 503 of MaskedWrite 501 causes the chip's 1 data output drivers to remain inactive and the signal PrechCamBit* 83 to be deactivated 509 which, in turn, allows both CamBit 85 and CamBit* 87 to be driven 506,507 according to the data input to the chip 1. Precharge* 83 is the internally generated signal which causes all CamWord 69 lines, FlagA 101 lines, FlagB lines 103, and EnableCompare 81 lines to be pulled down to $V_{SS}$ and all FlagBit 46 lines and QueryTrue 97 lines to be precharged up to $V_{DD}$. Precharge* 83 also causes all instances of EnableNext* 111 to be precharged to $V_{DD}$. Each CAM Bit Cell 37,39 contains an instance of EnableNext* 111. The Multiple Write operation, however, does not make use of EnableCompare 81, QueryTrue 97, or EnableNext* 111. ComparisonOp 89 is set to '1' in order to enable writing to each bit position in the CAM Array Word 33.

When the externally generated ChipEnable* 31 becomes active 505, Precharge* 83 and FlagAWrite 115 become inactive 511,512. Precharge* 83 becoming inactive 511 allows all FlagA 101 and FlagB 103 lines to float undriven. ChipEnable* 31 becoming active 505 also causes the FlagARead 113 line corresponding to the selected Flag Word 45 to become active 513. The activation 513 of this FlagARead 115 line causes that entire Flag Word 45 to be read 515 out of the Flag Memory 7 onto the FlagA 101 lines. This entire Flag Word 45 is input into the Flag Logic 15. Flag Logic 15 is selected to set FlagResult 55 to the value (Flag0)(-FlagA)(QueryTrue).

This is done by setting FlagLogicOpInternal 53 to '01000' as shown in the table in FIG. 6. Word Driver B 65 then drives 517 one or more CamWord 69 lines. The enabled 517 CamWord 69 lines cause bits in that CAM Array Word 33 to be written into from their two bit lines, CamBit 85 and CamBit* 87.

The selected Flag Word 45 is also input into the Flag Or 19 Circuit to form the signal ActiveWord* 61 which is output 519 from the chip 1. The External Priority Resolver 77 receives ActiveWord* 61 from each chip 1 in the entire system. Since each chip 1 in the system is assigned a priority, the External Priority Resolver 77 determines the highest priority chip 1 which has its ActiveWord* 61 signal asserted. The selected highest priority chip 1 receives 521 a '1' on its ChipPriorityIn 75 while all other chips 1 will receive 521 a '0' on their ChipPriorityIn 75. The value at ChipPriorityIn 75 is clocked into a bit in the Priority Register 27 on the next falling edge of ChipEnable* 31.

At the end of the Multiple Write Cycle, ChipEnable* 31 becomes inactive 523, which in turn causes Precharge* 83 to become active 525, which then in turn precharges 527 all FlagA 101 and FlagB 103 lines and also drives all FlagARead 115 lines and CamWord 69 lines inactive 529,531. FlagAWrite 61 remains inactive because Flag Bits 46 are not affected by this operation. The output drivers of the chip remain inactive when ChipEnable* 31 becomes inactive 523.

Masked-Multiple Write Cycle Timing

A Masked-Multiple Write Cycle is an operation which writes one word of data into one or more CAM Array Words 33 in one clock cycle. This operation is identical to the Multiple Write Cycle except that some CAM Array Word 33 bit positions can be unchanged by the operation. Bit positions with a '1' in the corresponding bit position in the Mask Register 11 are written, while those with a '0' are left unchanged. This operation is useful for changing part of the data in many CAM Array Words 33. Just as the Multiple Write Cycle, it requires use of CAM Bit Cell B 39 and Word Driver B 65. The Masked-Multiple Write operation selects a Flag Word 45, then writes data into the CAM Array 3 at every CAM Array Word 33 which has a '1' stored in its Flag Bit 46 within the selected Flag Word 45. The Multiple Write Cycle does not use the Priority Resolver 25 or change the value of any Flag Bits 46. The timing diagram for a Masked-Multiple Write Cycle is shown in FIG. 20.

The signal MaskedMultipleWrite 541 is a control signal decoded from CamOp 29, a set of external control signals which encode the operation the CAM chip 1 is to perform. MultipleWrite 541 must be asserted 543 an appropriate setup time prior to ChipEnable* 31 becoming active 545 to allow all FlagA 101 lines and FlagB 103 lines adequate time to be precharged to $V_{DD}$ and all CamBit 85 and CamBit* 87 lines and ComparisonOp 89 lines to be driven 546,547 to the value required by the data input from the External Data Bus 43 and the value stored in the Mask Register 11. If, for a particular CAM Array Word 33 bit position, the corresponding Mask Bit 50 has the value '1', CamBit 85 and CamBit* 87 are driven according to the input data. If the corresponding Mask Bit 50 has the value '0', CamBit 85 and CamBit* 87 are precharged to a '1' and then allowed to float.

Prior to ChipEnable* 31 becoming active 545, the assertion 543 of MaskedWrite 541 causes the chip's 1 data output drivers to remain inactive and the signal PrechCamBit* 83 to be deactivated 549 which, in turn, allows both CamBit 85 and CamBit* 87 to be driven 546,547 according to the data input to the chip 1 or allowed to float as designated by the Mask Register 11. Precharge* 83 is the internally generated signal which causes all CamWord 69 lines, FlagA 101 lines, FlagB lines 103, and EnableCompare 81 lines to be pulled down to $V_{SS}$ and all FlagBit 46 lines and QueryTrue 97 lines to be precharged up to $V_{DD}$. Precharge* 83 also causes all instances of EnableNext* 111 to be precharged to $V_{DD}$. Each CAM Bit Cell 37,39 contains an instance of EnableNext* 111. The Multiple Write operation, however, does not make use of EnableCompare 81, QueryTrue 97, or EnableNext* 111. ComparisonOp 89 is set to '1' in order to enable writing to each bit position in the CAM Array Word 33.

When the externally generated ChipEnable* 31 becomes active 545, Precharge* 83 and FlagAWrite 115 become inactive 551,552. Precharge* 83 becoming inactive 551 allows all FlagA 101 and FlagB 103 lines to float undriven. ChipEnable* 31 becoming active 545 also causes the FlagARead 113 line corresponding to the selected Flag Word 45 to become active 553. The activation 553 of this FlagARead 115 line causes that entire Flag Word 45 to be read 555 out of the Flag Memory 7 onto the FlagA 101 lines. This entire Flag Word 45 is input into the Flag Logic 15. Flag Logic 15 is selected to set FlagResult 55 to the value (Flag0)(-FlagA)(QueryTrue). This is done by setting FlagLogicOpInternal 53 to '01000' as shown in the table in FIG. 6. Word Driver B 65 then drives 557 one or more CamWord 69 lines. The enabled 557 CamWord 69 lines cause bits in that CAM Array Word 33 to be written into from their two bit lines, CamBit 85 and CamBit* 87, provided they 85,87 are driven.

The selected Flag Word 45 is also input into the Flag Or 19 Circuit to form the signal ActiveWord* 61 which is output 559 from the chip 1. The External Priority Resolver 77 receives ActiveWord* 61 from each chip 1 in the entire system. Since each chip 1 in the system is assigned a priority, the External Priority Resolver 77 determines the highest priority chip 1 which has its ActiveWord* 61 signal asserted. The selected highest priority chip 1 receives 561 a '1' on its ChipPriorityIn 75 while all other chips 1 will receive 561 a '0' on their ChipPriorityIn 75. The value at ChipPriorityIn 75 is clocked into a bit in the Priority Register 27 on the next falling edge of ChipEnable* 31.

At the end of the Multiple Write Cycle, ChipEnable* 31 becomes inactive 563, which in turn causes Precharge* 83 to become active 565, which then in turn precharges 567 all FlagA 101 and FlagB 103 lines and also drives all FlagARead 115 lines and CamWord 69 lines inactive 569,571. FlagAWrite 61 remains inactive because Flag Bits 46 are not affected by this operation. The output drivers of the chip remain inactive when ChipEnable* 31 becomes inactive 563.

What is claimed is:

1. A content-addresable memory including means for storing a plurality of words, each of said words comprising a plurality of data subfields, each of said data subfields being divided into a plurality of data bits, means for providing an input field comprising a plurality of input subfields matching some of said data subfields, and each said input subfield divided into input bits so as to have a one-to-one bit correspondence to the said data bits in said data subfields in said words, query means for simultaneously comparing said plurality of input subfields to all said words, with simultaneous subfield comparisons such that each said data subfield is compared to its corresponding said input subfield, and generation of a one bit query result for each said word which is true when all said data subfields within said word which are compared to one of said input subfields compare favorably to each corresponding said input subfield, flag memory means for storing a flag bit equal to said query result for each of said words.

2. A content-addressable memory as in claim 1 wherein said flag memory means include means for storing a plurality of said flag bits associated with each of said words.

3. A content-addressable memory as in claim 2 wherein said flag memory means includes means for outputting a multiplicity of output flag bits for each said word into flag logic means which performs a selectable Boolean operation for each said word on both said output flag bits and said query result to form a flag result for each said word and stores said flag result into said flag memory.

4. A content-addressable memory as in claim 3 including control means for causing said subfield comparison to be one of a plurality of different query comparison operations including either equality, less-than, less-than-or-equal-to, greater-than, greater-than-or-equal-to, inequality, or don't care.

5. A content-addressable memory as in claim 4 including a mask register having a plurality of mask bits, each of said mask bits corresponding to one bit in said word, and means for reading and writing said mask bits, each said mask bit being at a first logic state to allow the corresponding said data bits in said words to affect query comparison operations and a second logic state which causes the corresponding bit in all said words to be treated as not present within any subfield when query comparison operations are performed.

6. A content-addressable memory as in claim 5 including priority resolver means for selecting the highest priority said output flag bit from the multiplicity of said output flag bits for purposes of selecting one said word for reading or writing.

7. A content-addressable memory as in claim 6 wherein said means for performing said subfields comparisons include circuit means responsive to said query means capable of performing said query comparison operations.

8. A content-addressable memory as in claim 7 wherein said flag memory means includes a position associated with each said word for storing a flag bit defining said word as containing valid or invalid data.

9. A content-addressable memory as in claim 7 wherein selected said query comparison operation for all said subfield comparisons are the same.

10. A content-addressable memory as in claim 7 wherein each of said mask bits in said mask register being at a first logic state allows the writing of corresponding said data bit in said words and a second logic state which prevents overwriting corresponding said data bit in all said words.

11. A content-addressable memory as in claim 7 including flag or means for generating active word signal which is the logical OR of said multiplicity of output flag bits, each of said multiplicity of output flag bits corresponding to one said word.

12. A content-addressable memory comprising a plurality of content-addressable memories as in claim 11 and an external priority resolver means for communicating with each said content-addressable memory to select the highest priority said content-addressable memory in the system on the basis of said active word signal for purposes of selecting one of said content-addressable memories for reading or writing.

13. A content-addressable memory as in claim 1 wherein each said word comprises a plurality of said data bits stored in a plurality of cells, each cell comprising:
  a memory storage cell for storing the state of said bit,
  an exclusive OR circuit connected to said storage cell for comprising said bit to a corresponding bit in said input field,
  comparison means for determining the result of the overall said query comparison operation between said input field and said word, and
  means for propagating the result of said comparison from one cell to another.

14. A content-addressable memory as in claim 13 including a pair of transistors in series with said memory storage cell for implementing a masked write function whereby any of said cells can be protected from writing a new bit in said word.

15. A content-addressable memory as in claim 1 wherein said flag memory means include means for storing a plurality of said flag bits associated with each of said words.

16. A content-addressable memory as in claim 15 wherein said flag memory means includes means for outputting a multiplicity of output flag bits for each said word into flag logic means which performs a selectable Boolean operation for each said word on both said output flag bits and said query result to form a flag result for each said word and stores said flag result into said flag memory.

17. A content-addressable memory as in claim 16 including control means for causing said subfield comparison to be one of a plurality of different query comparison operations including either equality, less-than, less-than-or-equal-to, greater-than, greater-than-or-equal-to, inequality, or don't care.

18. A content-addressable memory as in claim 17 including a mask register having a plurality of mask bits,
  each of said mask bits corresponding to one bit in said word, and means for reading and writing said mask bits,
  each said mask bit being at a first logic state to allow the corresponding said data bits in said words to affect query comparison operations and a second logic state which causes the corresponding bit in all said words to be treated as not present within any subfield when query comparison operations are performed.

19. A content-addressable memory as in claim 18 including priority resolver means for selecting the highest priority said output flag bit from the multiplicity of said output flag bits for purposes of selecting one said word for reading or writing.

20. A content-addressable memory as in claim 19 including flag or means for generating active word signal which is the logical OR of said multiplicity of output flag bits, each of said multiplicity of output flag bits corresponding to one said word.

21. A content-addressable memory comprising a plurality of content-addressable memories as in claim 20 and an external priority resolver means for communicating with each said content-addressable memory to select the highest priority said content-addressable memory in the system on the basis of said active word signal for purposes of selecting one of said content-addressable memories for reading or writing.

22. A content-addressable memory as in claim 21 wherein said plurality of input subfields is equal in number to said data subfields in each said word.

23. A content-addressable memory as in claim 21 including address decoder means for decoding an external address to select single words for reading or writing.

24. A content-addressable memory as in claim 7 including address decoder means for decoding an external address to select single words for reading or writing.

25. A content-addressable memory as in claim 6 wherein said plurality of input subfields is equal in number to said data subfields in each said word.

* * * * *